United States Patent
Zhang et al.

(10) Patent No.: US 11,901,108 B2
(45) Date of Patent: Feb. 13, 2024

(54) POWER MODULE AND POWER DEVICE

(71) Applicant: Delta Electronics (Shanghai) Co., Ltd., Shanghai (CN)

(72) Inventors: Jin-Fa Zhang, Shanghai (CN); Hai-Jun Yang, Shanghai (CN); Zhong-Wei Ke, Shanghai (CN); Kai Dong, Shanghai (CN); Shuai-Lin Du, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 593 days.

(21) Appl. No.: 16/953,365

(22) Filed: Nov. 20, 2020

(65) Prior Publication Data

US 2021/0076540 A1    Mar. 11, 2021

Related U.S. Application Data

(63) Continuation-in-part of application No. 15/600,913, filed on May 22, 2017, now Pat. No. 10,847,455.

(30) Foreign Application Priority Data

May 25, 2016    (CN) .......................... 201610352569.3

(51) Int. Cl.
  *H01F 27/28*    (2006.01)
  *H05K 7/20*    (2006.01)
  (Continued)

(52) U.S. Cl.
  CPC ......... *H01F 27/2804* (2013.01); *H01F 17/04* (2013.01); *H01F 27/28* (2013.01);
  (Continued)

(58) Field of Classification Search
  CPC ...... H01F 27/2804; H01F 27/04; H01F 27/06; H01F 2027/065; H01F 27/2823;
  (Continued)

(56) References Cited

U.S. PATENT DOCUMENTS 8,421,578 B2    4/2013    Huang et al.
2002/0057158 A1    5/2002    Matsumoto et al.
(Continued)

FOREIGN PATENT DOCUMENTS

CN    1099530 A    3/1995
CN    1615675 A    5/2005
(Continued)

*Primary Examiner* — Shawki S Ismail
*Assistant Examiner* — Kazi S Hossain
(74) *Attorney, Agent, or Firm* — CKC & Partners Co., LLC

(57) ABSTRACT

A power module includes a printed circuit board (PCB), a magnetic element, primary and secondary winding circuits and a regulator. The magnetic element is disposed on the PCB and has first to fourth sides. The second side is opposite to the first side, the fourth side is opposite to the third side. The primary winding circuit is disposed on the PCB and positioned in a vicinity of the first or second side. The secondary winding circuit is disposed on the first PCB and positioned in a vicinity of the third or fourth side. The regulator includes a switch disposed on the PCB, and coupled to the primary winding circuit. The at least one switch, the primary winding circuit, and the magnetic element are arranged in a first direction in order. A power device is also disclosed herein.

22 Claims, 28 Drawing Sheets

(51) Int. Cl.
*H05K 1/18* (2006.01)
*H05K 1/14* (2006.01)
*H01F 17/04* (2006.01)
*H02M 1/42* (2007.01)
*H01F 17/00* (2006.01)
*H02M 1/00* (2006.01)
*H02M 3/00* (2006.01)
*H02M 3/335* (2006.01)

(52) U.S. Cl.
CPC ......... *H02M 1/4225* (2013.01); *H05K 1/141* (2013.01); *H05K 1/181* (2013.01); *H05K 7/20909* (2013.01); *H01F 2017/0093* (2013.01); *H02M 1/0085* (2021.05); *H02M 3/003* (2021.05); *H02M 3/01* (2021.05); *H02M 3/33573* (2021.05); *H05K 2201/045* (2013.01); *H05K 2201/1003* (2013.01); *H05K 2201/1006* (2013.01)

(58) Field of Classification Search
CPC .... H01F 27/2847; H01F 27/085; H01F 27/40; H01F 27/306; H05K 1/141; H05K 2201/086; H05K 2201/10053; H05K 1/181; H05K 2201/09063; H05K 2201/1003; H05K 1/0262; H02M 1/0058; H02M 1/007; H02M 3/155; H02M 3/003; H02M 3/33576; Y02B 70/10
USPC .................................. 336/221, 212, 220, 180
See application file for complete search history.

(56) References Cited

U.S. PATENT DOCUMENTS

| 2003/0142513 | A1* | 7/2003 | Vinciarelli | H02J 1/102 363/17 |
| 2005/0024179 | A1 | 2/2005 | Chandrasekaran et al. | |
| 2005/0110606 | A1 | 5/2005 | Vinciarelli | |
| 2007/0201211 | A1 | 8/2007 | Loiler et al. | |
| 2008/0024259 | A1 | 1/2008 | Chandrasekaran et al. | |
| 2009/0309684 | A1* | 12/2009 | Tsai | H01F 27/325 336/105 |
| 2010/0141371 | A1 | 6/2010 | Wang | |
| 2010/0321960 | A1 | 12/2010 | Nakahori | |
| 2012/0212314 | A1 | 8/2012 | Li et al. | |
| 2013/0278373 | A1 | 10/2013 | Hara et al. | |
| 2014/0063721 | A1 | 3/2014 | Herman et al. | |
| 2014/0266530 | A1 | 9/2014 | Andres et al. | |
| 2015/0048917 | A1* | 2/2015 | Uchiyama | H01F 27/2804 336/200 |
| 2015/0282370 | A1 | 10/2015 | Yang et al. | |
| 2015/0348694 | A1 | 12/2015 | Sakuma et al. | |
| 2016/0088754 | A1* | 3/2016 | Francis | H05K 13/04 361/752 |
| 2016/0241150 | A1* | 8/2016 | Hsu | H02M 1/08 |
| 2018/0040410 | A1* | 2/2018 | Hamada | H05K 1/0262 |

FOREIGN PATENT DOCUMENTS

| CN | 201160024 Y | 12/2008 |
| CN | 201708703 U | 1/2011 |
| CN | 202142997 U | 2/2012 |
| CN | 203205229 U | 9/2013 |
| CN | 103348577 A | 10/2013 |
| CN | 103378748 A | 10/2013 |
| CN | 105099132 A | 11/2015 |
| JP | 2010193536 A | 9/2010 |
| JP | 2011023633 A | 2/2011 |

* cited by examiner

POWER MODULE AND POWER DEVICE

CROSS-REFERENCE TO RELATED APPLICATION

This application is a Continuation-in-part of U.S. application Ser. No. 15/600,913, filed on May 22, 2017, which claims priority of China Application Serial Number 201610352569.3, filed on May 25, 2016, the entirety of which is incorporated by reference herein in their entireties.

BACKGROUND

Field of Invention

The present disclosure relates to a power module and a power device.

Description of Related Art

In the fields of server and telecom or the like, the conventional power device includes main board, at least one power module mounted on the main board and other functional components. Further, main power semiconductor devices are integrated in the power module. The design of the power module is particularly important for achieving high efficiency, high power density, high reliability and low cost.

FIG. 1a shows a structural block diagram of a conventional power module. The power module includes a primary winding circuit, a secondary winding circuit, and an isolation transformer between the primary winding circuit and the secondary winding circuit. FIG. 1b shows a schematic perspective diagram of a conventional power module. As shown in FIG. 1b, the conventional power module includes a PCB 31, an isolation transformer 32, a primary winding circuit 33 and a secondary winding circuit 34. The isolation transformer 32 is located in middle of the PCB 31, and the primary winding circuit 33 and the secondary winding circuit 34 are positioned on the PCB 31 and located on opposite sides of the isolation transformer 32.

In low-voltage and large-current applications, an architecture of a transformer that a plurality of primary windings connected in series and a plurality of secondary windings connected in parallel is generally employed in order to improve the power density and efficiency of the power device. Referring to a schematic circuit diagram of a conventional power module as shown in FIG. 1c. For a conventional circuit as shown in FIG. 1c, it is difficult to achieve a series connection or a parallel connection of two or more isolation transformers in a single power module, due to the arrangement of the primary winding and secondary winding of the transformer.

If it is desired to further increase the power, the only way for the conventional architecture of power module is to increase the number of layers of the PCB. However, when PCB layers increase, it will introduce a number of problems such as significant increase in PCB costs, heat-dissipation difficulty of the inner layer of the PCB windings, the increase in loss caused by current unbalance of the PCB layers, and so on. The isolation transformer blocks the normal air flow, and thus the primary winding circuit 33 or the secondary winding circuit 34 suffers from overheating, which results in low conversion efficiency of the power device. In addition, in the conventional power device, the electrical path between the secondary winding of the isolation transformer and the secondary winding circuit is long, and the connection trace is relatively long. For example, the length of the connection trace is up to 40 mm, thereby increasing trace loss of the power device, which is not beneficial to improve the power density and efficiency of the power device.

The above information disclosed in the background technology section is only used to facilitate understanding the background of the present disclosure, and thus it may include information which does not construct the prior art well-known by the person skilled in the related art.

SUMMARY

According to an aspect of the present disclosure, a power module includes a first printed circuit board (PCB), a magnetic element, a primary winding circuit, a secondary winding circuit and a regulator. The magnetic element is disposed on the first PCB. The magnetic element has a first side, a second side, a third side and a fourth side. The second side is opposite to the first side, the fourth side is opposite to the third side. The primary winding circuit is disposed on the first PCB and positioned in a vicinity of the first side or the second side of the magnetic element. The secondary winding circuit is disposed on the first PCB and positioned in a vicinity of the third side or the fourth side of the magnetic element. The regulator is configured to provide a first voltage to the primary winding circuit. The regulator includes at least one switch disposed on the first PCB, and coupled to the primary winding circuit. The at least one switch, the primary winding circuit, and the magnetic element are arranged in a first direction in order.

According to another aspect of the present disclosure, a power device includes a mainboard, and the power module as described above. The first PCB is disposed on the mainboard with the first direction corresponding to the direction from an input terminal to an output terminal of the power device.

According to another aspect of the present disclosure, a power device includes a mainboard, at least one power module and a regulator. The at least one power module disposed on the mainboard with a first direction corresponding to a direction from an input terminal to an output terminal of power device. Each of the at least one power module includes a first printed circuit board (PCB), a magnetic element, a primary winding circuit and a secondary winding circuit. The magnetic element is disposed on the first PCB. The magnetic element has a first side, a second side, a third side and a fourth side, wherein the second side is opposite to the first side, the fourth side is opposite to the third side. The primary winding circuit is disposed on the first PCB and positioned in the vicinity of the first side or the second side of the magnetic element. The secondary winding circuit is disposed on the first PCB and positioned in the vicinity of the third side or the fourth side of the magnetic element. The regulator is disposed on the mainboard, arranged with the at least one power module in the first direction, and configured to provide at least one voltage to the at least one power module.

The additional aspects and advantages of the present disclosure will be partly set forth in the following description, and partly become apparent from the description or learned from practice of the present disclosure.

BRIEF DESCRIPTION OF THE DRAWINGS

The above and other features and advantages of the present disclosure will become more apparent by describing exemplary embodiments thereof with reference to the attached drawings.

DETAILED DESCRIPTION

Figure 1A:
FIG. 1a shows a structural block diagram of a conventional power module.
Figure 1B:
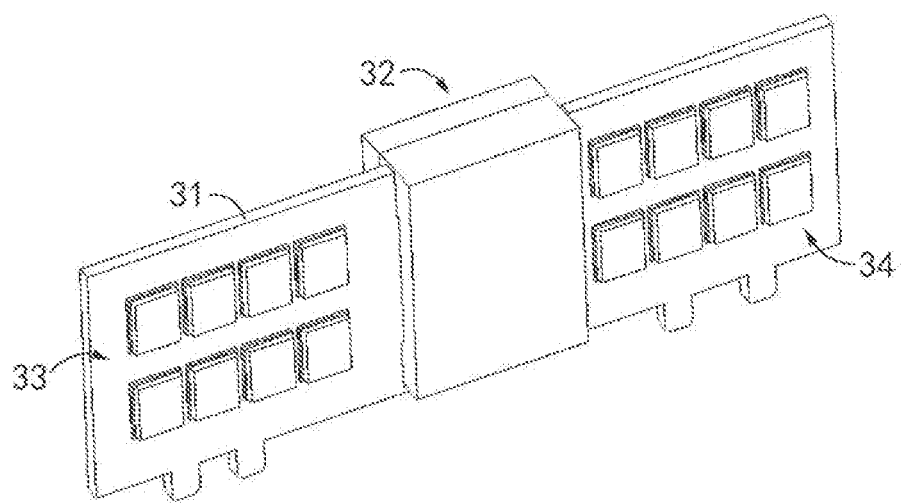
FIG. 1b shows a block diagram of a conventional power module.
Figure 1C:
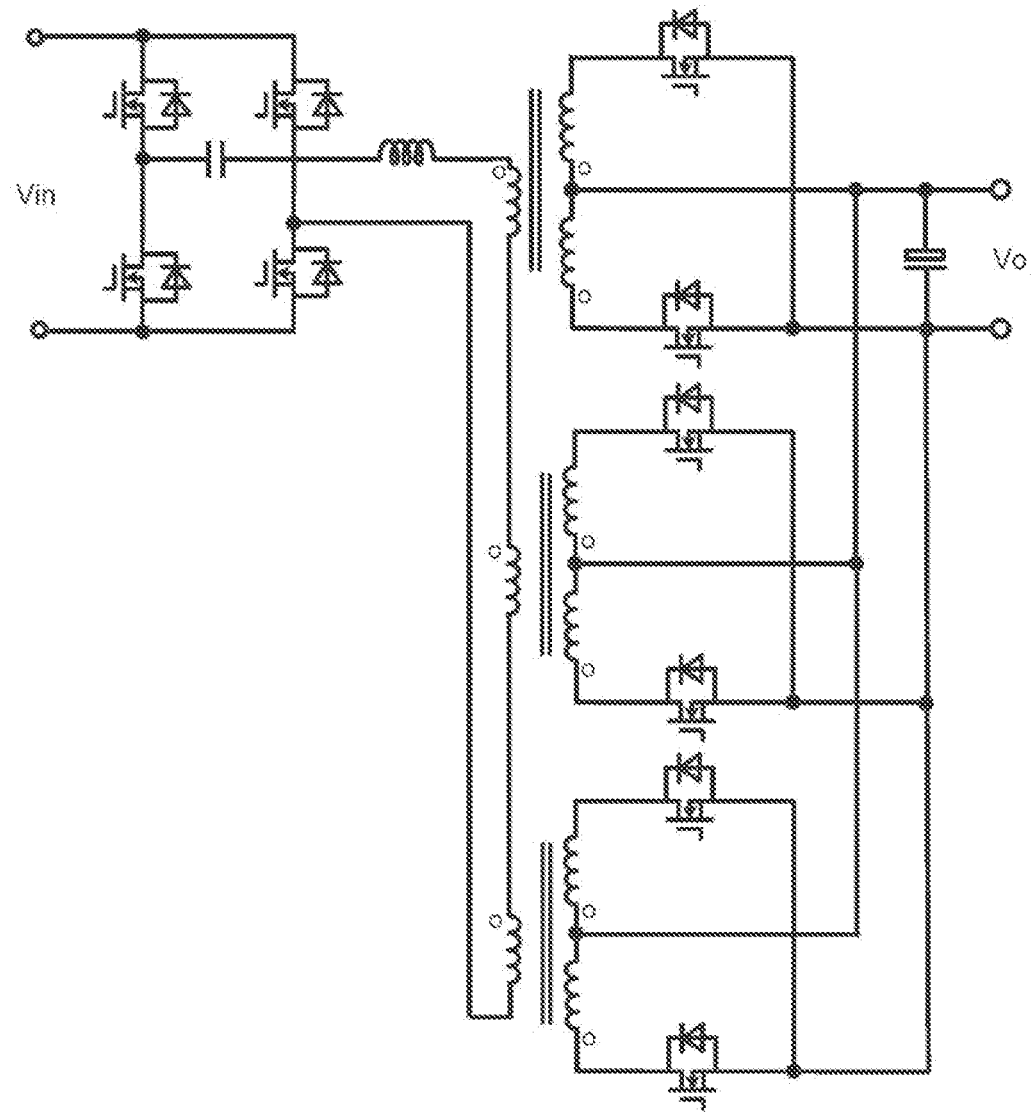
FIG. 1c shows a schematic diagram of a conventional power module, in which a plurality of secondary winding circuits are connected in parallel.

Now, exemplary embodiments of the present disclosure will be more fully described with reference to the attached drawings. However, the exemplary embodiments can be implemented in various ways, and should not be construed as being limited to the embodiments set forth herein, rather, these embodiments are provided so that the present disclosure will be thorough and complete, and will fully convey the scope of the present disclosure to the person skilled in the related art. Throughout the drawings, the same reference numerals are used to refer to the same or similar structure, and thus its detail description will be omitted as necessary.

The terms "a", "an", "the", "said" and "at least one", when describing element/constituent/or the like as described and/or shown herein, are used to express the presence of one or more the element/constitute/or the like. The terms "include", "comprise" and "have", as used herein, are intended to be inclusive, and mean there may be additional elements/constituents/or the like other than the listed elements/constituents/or the like. The relativity words, such as "upper" or "lower", as used herein, are used to describe the relative relationship of the referenced component to another component. It is appreciated that if the referenced device is inversed upside down, the component indicated as being the "upper" side would become the component on the "lower" side. In addition, the words "first", "second", or the like, as used in claims, are meant to indication, but not to limit the object to which they modify.

The present disclosure provides a power module and a power device including the power module, which have better thermal conductivity effect and reduced trace loss of the secondary winding of the power module. The power density and efficiency of the power device may be significantly improved without increasing the number of layer of the PCB.

Figure 2:
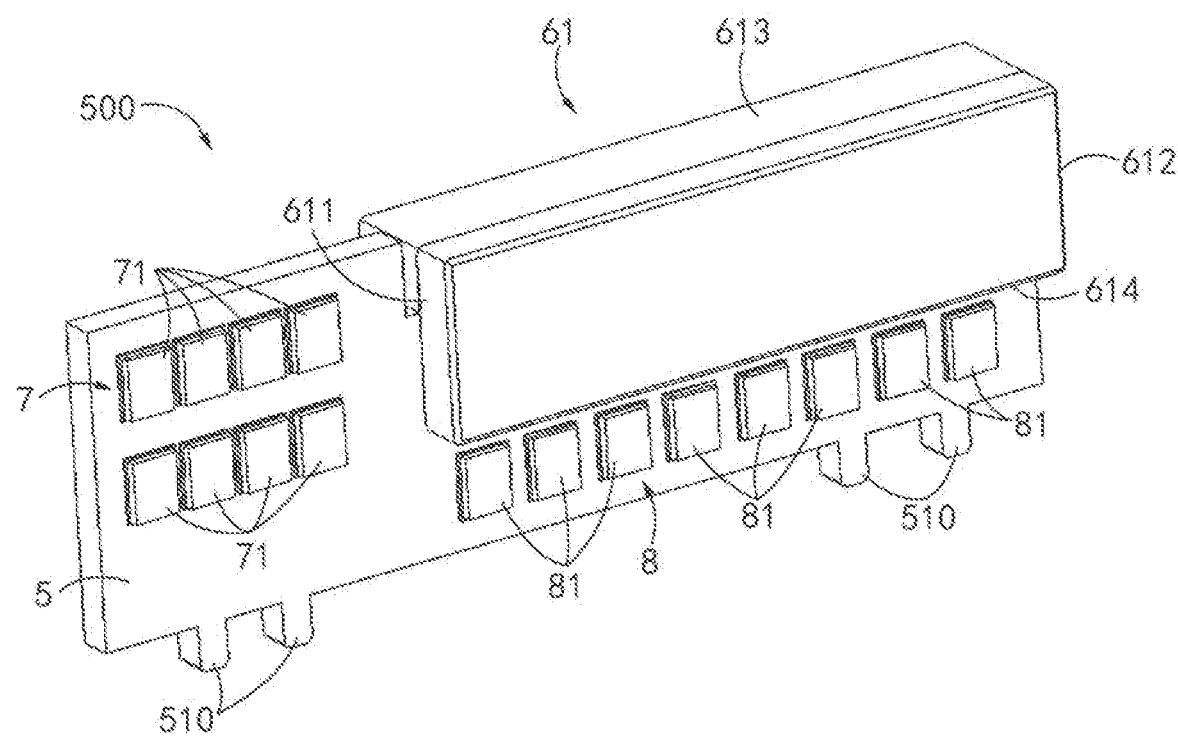
FIG. 2 is a block diagram of the power module according to an exemplary embodiment of the present disclosure.
Figure 3:
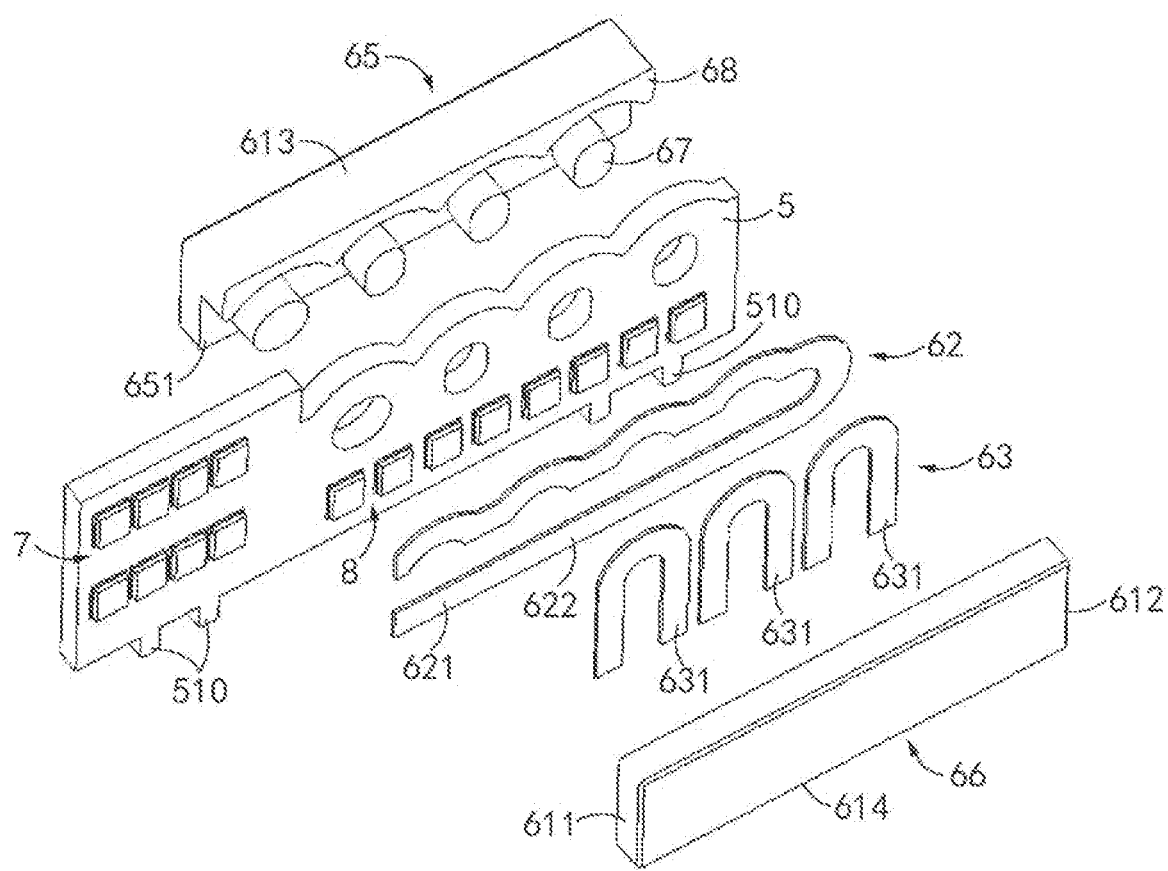
FIG. 3 is an exploded perspective diagram of the power module as shown in FIG. 2.

FIG. 2 is a block diagram of the power module according to an exemplary embodiment of the present disclosure; FIG. 3 is an exploded perspective diagram of the power module as shown in FIG. 2. Referring to FIGS. 2 and 3, a power module 500 includes a PCB 5, a magnetic element, a primary winding circuit 7 and at least one secondary winding circuit 8.

The PCB 5 is divided into two regions, wherein the magnetic element and the secondary winding circuit 8 are provided on one region of the PCB 5, and the primary winding circuit 7 is provided on the other region of the PCB 5. For example, as shown in FIGS. 2, 3, the primary winding circuit 7 is located on left side region of the PCB 5, the magnetic element and secondary winding circuit 8 are located on right side region of the PCB 5, and may be arranged in an upper row and a lower row. Certainly, the present disclosure is not limited thereto, the magnetic element, the primary winding circuit and the secondary winding circuit may also have other arrangements on the PCB.

The magnetic element is provided on the PCB 5 and includes a core structure 61, a primary winding 62 and at least one secondary winding 63.

The core structure 61 of the magnetic element presents in a shape of strip and has a first side 611, a second side 612 opposite to the first side 611, a third side 613 and a fourth side 614 opposite to the third side 613. The third side 613 and the fourth side 614 are connected with the first side 611 and the second side 612, respectively. The first side 611, the second side 612, the third side 613 and the fourth side 614 may together form a shape of rectangle. In addition, the third side 613 and the fourth side 614 may be surfaces extending along the length direction of the core structure 61, respectively.

The primary winding circuit 7 is coupled with the primary winding 62 of the magnetic element. The primary winding circuit 7 is positioned on the PCB 5 in the vicinity of the first side 611 of the core structure 61. In other words, the primary winding circuit 7 is located on left side of the magnetic element.

The secondary winding circuit 8 is coupled with at least one secondary winding 63 of the magnetic element, respectively. The secondary winding circuit 8 is positioned on the PCB 5 in the vicinity of the fourth side 614 of the core structure 61. In other words, the secondary winding circuit 8 is located under the magnetic element.

With the arrangement of the magnetic element, the primary winding circuit 7 and the secondary winding circuit 8 on the PCB 5, the cooling air from the left side of the power module may cool all of the magnetic element, the primary winding circuit 7 and the secondary winding circuit 8 smoothly, so that the power module has an excellent thermal conductivity effect.

It should be noted that the above description of the magnetic element, the primary winding circuit and the secondary winding circuit on the PCB is exemplary, and may not be construed as a limitation of the present disclosure. As should be appreciated by those skilled in the art, the arrangement of the magnetic element, the primary winding circuit and the secondary winding circuit on the PCB may be in other manners. For example, the primary winding circuit 7 is optionally positioned in the vicinity of the first side 611 or the second side 612, and the secondary winding circuit 8 is optionally positioned in the vicinity of the third side 613 or the fourth side 614.

Figure 4:
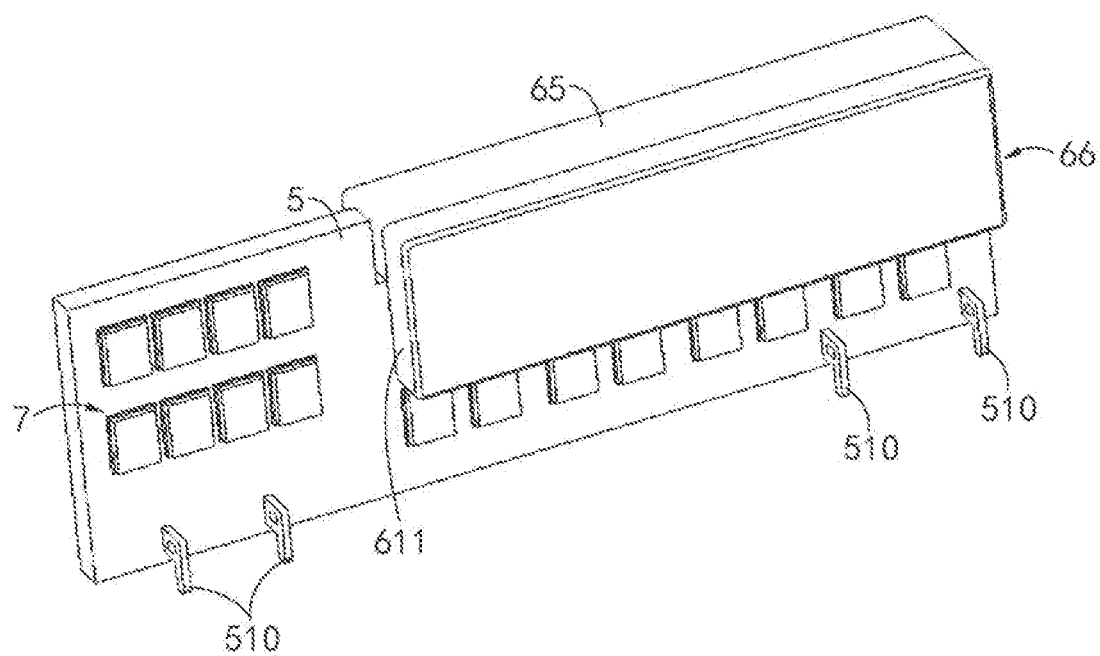
FIG. 4 is a block diagram of the power module according to another exemplary embodiment of the present disclosure.
Figure 5:
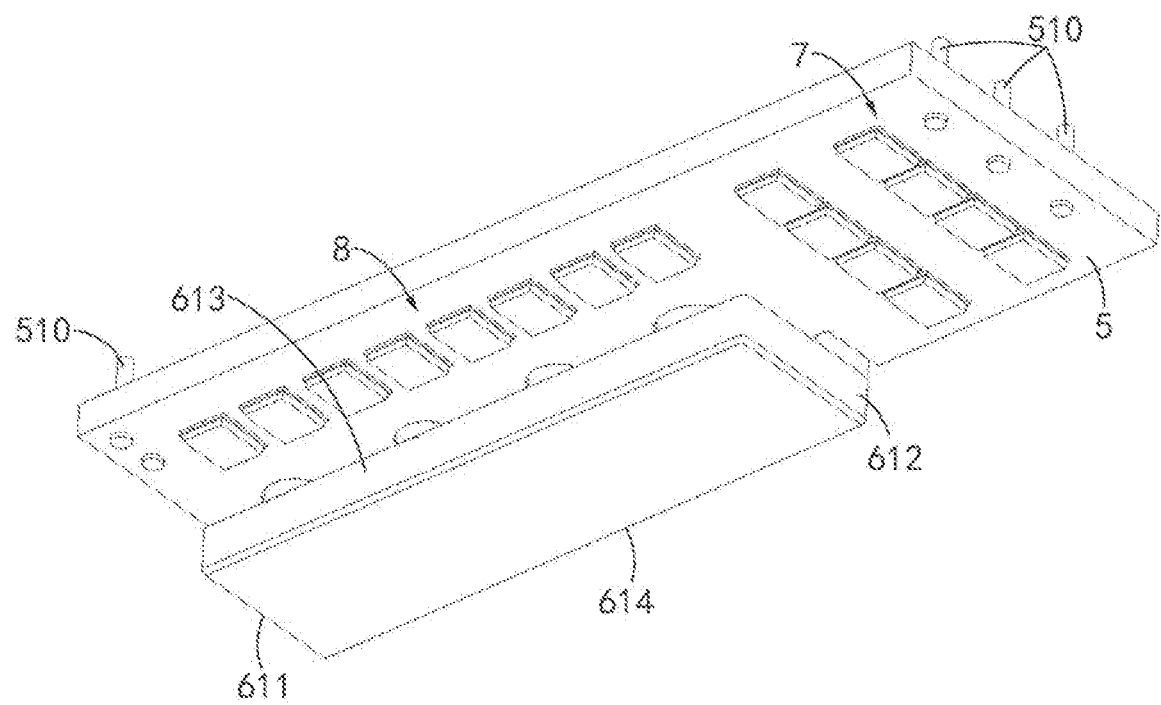
FIG. 5 is a block diagram of the power module according to another exemplary embodiment of the present disclosure.

Besides, the power module further includes pins 510, which are configured to realize the electrical connection and fixation between the power module and the main board. As shown in FIG. 2, the pins 510 are provided under the PCB 5, and the pin 510 may be parallel with the PCB 5, or may be provided on the same surface with the PCB 5. In an embodiment, the pin 510 may be formed by partial PCB of the PCB 5. As shown in FIG. 2, the pins 510 may be electrically connected with the main board via a PCB termination. In another embodiment, the pins 510 may be made of metal material, which electrically connects with the main board using its own metal conductivity characteristic, as shown in FIG. 4. In another embodiment, the pins 510 may be positioned at a place as shown in FIG. 5, the pins 510 may be perpendicular to the PCB 5. However the present disclosure in not limited thereto, the position of the pins 510 may be adjusted according to the actual requirements.

The primary winding circuit 7 may include at least one switch 71, which is in the vicinity of the first side 611 or the second side 612 of the core structure 61. When the primary winding circuit 7 includes a plurality of switches 71, those switches 71 may be arranged in two rows parallel with each other, wherein each row may be arranged along the length direction of the core structure 61 (see FIG. 2). In other embodiments, each row of the switches 71 may be arranged perpendicular to the length direction of the core structure 61 (see FIG. 5). In another embodiment, each row of the switches 71 may form an angle with a length direction of the core structure 61 (not shown in Figures). Certainly, the present disclosure is not limited thereto, a plurality of switches 71 forming the primary winding circuit 7 may be arranged in other manners, such as arranging in three rows or four rows, or arranging in a shape of circle, etc.

The secondary winding circuit 8 may include at least one switch 81. When the secondary winding circuit 8 includes a plurality of switches 81, those switches 81 may arranged along the length direction of the core structure 61. As shown in FIG. 2, the switches 81 may be positioned in the vicinity of the fourth side 614 of the core structure 61, that is, the switches 81 may be positioned under the core structure 61. Thus, the lead direction of the secondary winding 63 along the direction from the top to the bottom may be directly and electrically connected with the secondary winding circuit 8 without being bent. Furthermore, because of the significant reduction of the electrical path and trace loss in the secondary winding, the efficiency of the power module and the power device may be improved. Certainly, the present disclosure is not limited thereto, the switches 81 of the secondary winding circuit 8 may be alternatively positioned in the vicinity of the third side 613 (see FIG. 5). The switches 81 forming the secondary winding circuit 8 may not be necessarily arranged in one row along the length direction of the core structure 61. Those switches 81 may also be arranged in other manners. For example, those switches 81 may be arranged in two rows (not shown). Furthermore, the switches 81 in two rows may be in a pair-wise alignment, or in a staggered arrangement, etc.

The arrangement of the switches 71 forming the primary winding circuit 7 and the arrangement of the switches 81 forming the secondary winding circuit 8 may be any combination two-by-two, thus various arrangements may be formed by the core structure 61, the primary winding circuit 7 and the secondary winding circuit 8. The number and connection manners of the primary winding circuit 7 and the secondary winding circuit 8 may not be limited. For example, in some embodiments, the output terminals of the secondary winding circuits 8 may be connected in parallel.

Figure 6:
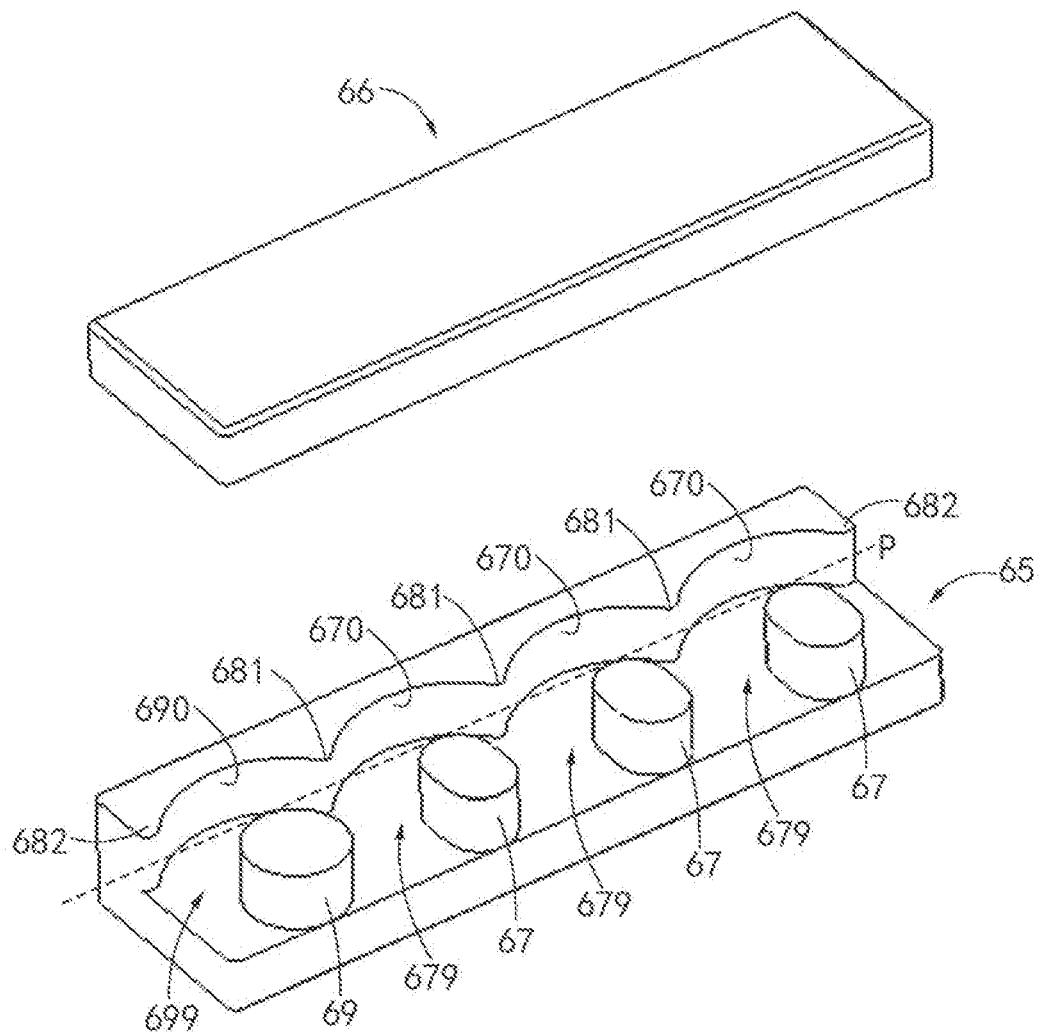
FIG. 6 is an exploded perspective diagram of the core structure of the power module according to an exemplary embodiment of the present disclosure.

FIG. 6 shows the perspective diagram of the core structure 61. Referring to FIGS. 2, 3, 6, the core structure 61 of the magnetic element may include a first magnetic cover 65, a second magnetic cover 66, four winding poles and a common side pole 68. The number of the winding pole may not be limited to four, and the number of the winding poles may be increased or decreased according to factors such as volume size of the core structure 61 in practical application.

The first magnetic cover 65 has a first surface 651, which may assembly with the second magnetic cover 66 (see FIG. 3).

In an exemplary embodiment, all of four winding poles and one common side pole 68 may be formed on the first magnetic cover 65. It will be understood by those skilled in the art that, the present disclosure is not limited thereto. In other exemplary embodiment, the winding poles and the common side pole 68 may also be formed on the second magnetic cover 66; or one of the winding poles and common side pole 68 may be formed on the first magnetic cover 65, and the rest may be formed on the second magnetic cover 66.

The four winding poles may be provided between the first magnetic cover 65 and the second magnetic cover 66, and are located on side of the first surface 651. One or more of the winding poles may be inductor magnetic pole, which may be used for an inductor winding, and other winding poles may be transformer magnetic pole, which may be used to wind a primary winding 62 and secondary winding 63 thereon.

As shown in FIG. 6, one winding pole is an inductor magnetic pole 69, which has a cross-section shape of circle, and the other three winding poles are transformer magnetic pole 67, each of which has a cross-section shape of oval. The transformer magnetic pole 67 and the inductor magnetic pole 69 may have the same cross-section shape or the different cross-section shape.

The common side pole 68 is provided between the first magnetic cover 65 and the second magnetic cover 66, and positioned on the other side of the first surface 651, opposite to the transformer magnetic pole 67 and the inductor magnetic pole 69.

A plurality of first protrusions 681 may be provided on the side surface of the common side pole 68 towards four winding poles, which extend towards the gap formed between the inductor magnetic pole 69 and the transformer magnetic pole 67, respectively. In one embodiment, the first protrusion 681 extends to or beyond a virtual surface P. The virtual surface P is defined as a surface connecting with side walls of the inductor magnetic pole 69 and the transformer magnetic pole 67 towards the common side pole 68. The side surface of the common side pole 68 towards the inductor magnetic pole 69 and the transformer magnetic pole 67 includes four curved surfaces corresponding to the inductor magnetic pole 69 and the transformer magnetic pole 67 respectively. Each of the four curved surfaces protrudes in a direction away from the corresponding winding pole. More specifically, the curved surfaces 690 corresponding to the inductor magnetic pole 69 protrude in a direction away from the inductor magnetic pole 69, and the curved surfaces 670 corresponding to the transformer magnetic pole 67 protrude in a direction away from the transformer magnetic pole 67. That is to say, the curved surface may be partially surrounding the magnetic pole. The first protrusion 681 may be formed at the connection position of four curved surfaces 690, 670. In an embodiment, the first protrusion 681 may support the core so as to maintain the air gap of the inductor or the transformer stable and to keep consistent inductance value.

The curved surface of the common side pole 68 has a projection on the first magnetic cover 65, and the projection presents a shape of circular, partial elliptical or partial runway. As shown in FIG. 6, four curved surfaces 690, 670 of the common side pole 68 have the same shape. In other embodiment, multiple curved surfaces of the common side pole 68 may be various.

In an embodiment, the curved surface of the common side pole 68 has a shape corresponding to that of the winding pole, for example, the inductor magnetic pole 69 has a cross-section of circle, and accordingly the curved surface 690 of the inductor magnetic pole 69 has a shape of partial circular arc (see FIG. 6); The transformer magnetic pole 67 has a cross-section of oval, and accordingly the curved surface 670 of the transformer magnetic pole 67 has a shape of circular arc surface. However the present disclosure is not limited thereto, the curved surface of the common side pole 68 may has a shape not compatible with that of cross-section of the winding pole. For example, the winding pole has a cross-section of circular, while the curved surface has a shape of runway.

A holding space 699 is defined between the curved surface 690 of the common side pole 68 and corresponding inductor magnetic pole 69, which may use for disposing the inductor winding; A holding space 679 is defined between the curved surface 670 of the common side pole 68 corresponding transformer magnetic pole 67, which may be used for disposing the transformer winding.

In other embodiment, second protrusions 682 are provided at two ends of the common side pole 68 respectively. And the second protrusions 682 may be corresponding to two ends of the first magnetic cover 65 and may extend along the same direction as that of the first protrusion 681.

In an embodiment as shown in FIG. 6, the first magnetic cover 65, the inductor magnetic pole 69, the transformer magnetic pole 67 and the common side pole 68 may collectively constitute a special E-type magnetic core, and the second magnetic cover 66 may be an I-type magnetic core, thus forming an EI-type core structure by assembling the first magnetic cover 65 and the second magnetic cover 66. It is to be appreciated that the core structure according to present disclosure is not limited to EI-type core structure. For example, the core structure may also be an EE-type core structure and so on.

The structure of the magnetic element will be briefly described combining the inductor winding 621, the primary winding 622 and the secondary winding 63 as follows.

Figure 7:
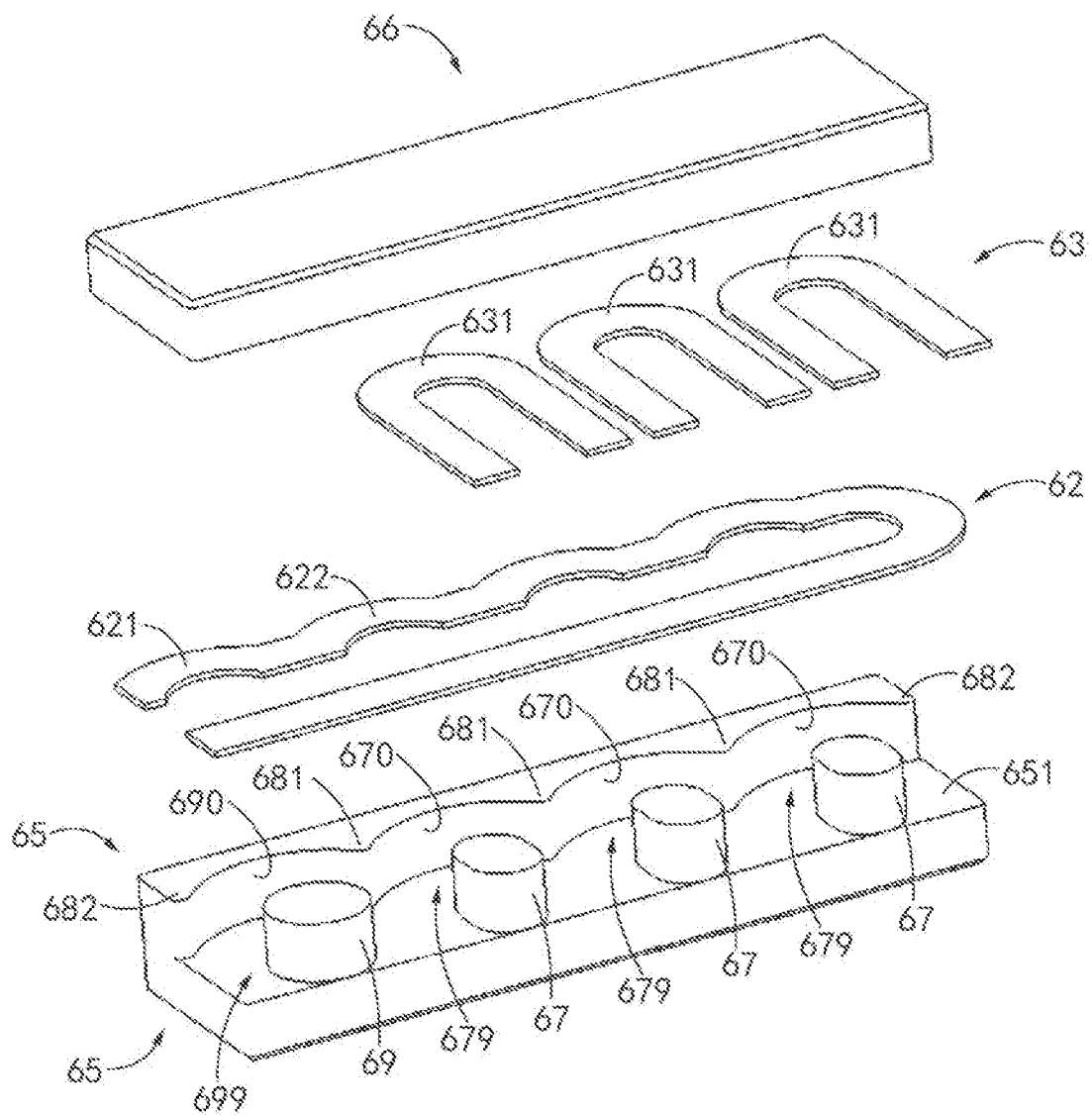
FIG. 7 is an exploded perspective diagram of the magnetic element of the power module according to an exemplary embodiment of the present disclosure.

FIG. 7 is an exploded perspective diagram of the magnetic element of the power module, which shows the winding manner of the primary winding 622 and secondary winding 63 on the transformer magnetic pole 67. As shown in FIGS. 3, 7, the inductor winding 621 and primary winding 622 may be formed totally by one piece of wire, which may wound around four winding poles, that is, the wire may encircle all of the winding poles. A part of the wire corresponding to the inductor magnetic pole 69 may form the inductor winding 621, and other part of the wire corresponding to the transformer magnetic pole 67 may form the transformer winding 622. The lead direction of the wire formed the inductor winding 621 and the primary winding 622 may be along the arrangement direction of four transformer magnetic poles 67, that is, along the length direction of the core structure 61. It is very convenient for the wire directly extending from the first side 611 of the core structure 61. Referring to FIG. 3, under such condition, and the outgoing trace of the primary winding 622 may be coupled with the primary winding circuit 7 which is positioned in the vicinity of the first side 611. Thus, the electrical path between the primary winding 622 and the primary winding circuit 7 may be relatively short. The previous description of the primary winding 622 and its lead direction may be exemplary and not limited to present disclosure.

The winding 63 may include three pieces of wire sections 631, each of which is wounded around one of the transformer magnetic poles 67. The lead direction of the three wire sections may be far away from the common side pole 68, and may be perpendicular to the length of the common side pole 68. In present exemplary embodiment, the length direction of the common side pole 68 may be coincident with the length direction of the core structure 61. Referring to FIG. 3, the outgoing traces of the three wire sections 631 of the secondary winding 63 (the outgoing traces of the secondary winding 63) may directly extend from the fourth side 614 of the core structure 61, which is very convenient. The outgoing traces of the secondary winding 63 may be in the vicinity of the secondary winding circuit 8, and the pins 510 of the PCB 5 may be positioned under the core structure 61 and may be in the vicinity of the secondary winding circuit 8. Therefore, the electrical path may be shortened and trace loss of the secondary winding circuit may be reduced according to the present disclosure.

The previous description of the primary winding 622, the secondary winding 63 and their outgoing traces are exemplary rather than a limiting to present disclosure. The secondary winding 63 may be other structure. For example, the secondary winding 63 may include two, four or more section wires, or the secondary winding 63 may be formed by conductive sheet. The lead direction of the outgoing traces of the three wire sections may form an angle of 45°~135° with the length direction of the common side pole 68 such as 45°, 60°, 100°, 120°, 135°, etc.

The wire of the primary winding 622 or the wire of the secondary winding 63 may be an enameled-wire or a PCB winding formed in the PCB 5.

Figure 8:
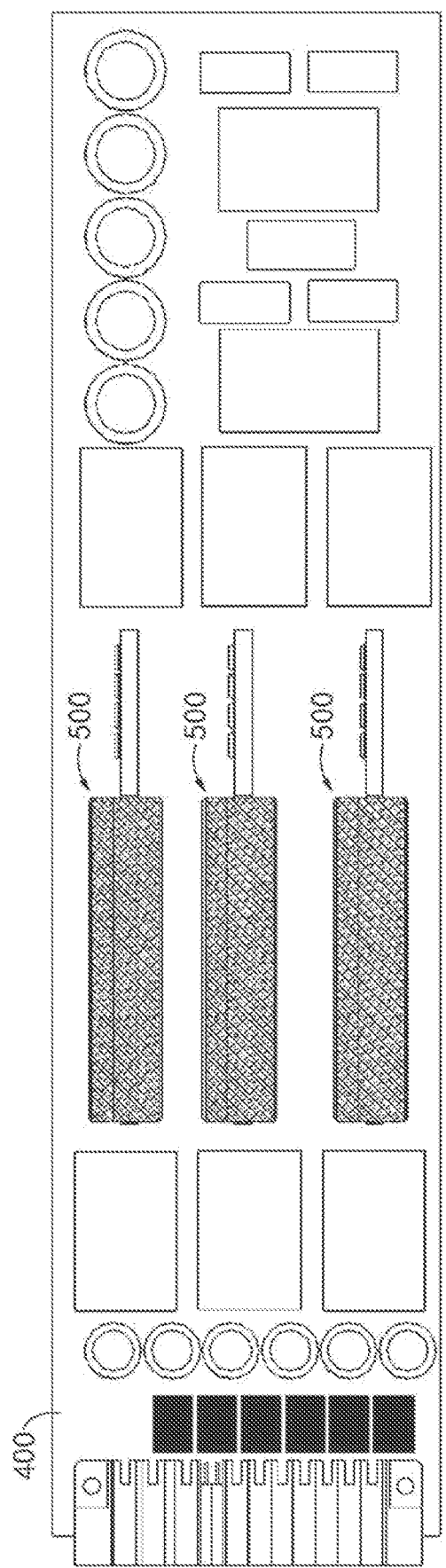
FIG. 8 is a block diagram of the power device according to an exemplary embodiment of the present disclosure.

Referring to FIG. 8, FIG. 8 is a block diagram of the power device according to an exemplary embodiment of the present disclosure. As shown in FIG. 8, the power device may include a main board 400 and at least one power module 500. The main power semiconductor component of the power device may be integrated together into the power module 500. FIG. 8 shows three power modules 500. However, the number of the power modules 500 may increase or decrease according to actual requirement. In the present embodiment, the power module 500 may be a power module as shown in FIG. 2. The power module 500 has a plurality of pins 510, which may be parallel with the PCB (referring to FIG. 2). The main board 400 is provided with holes (not shown) for which the pins 510 may insert in. The power module 500 may achieve electrical connection and fixation with the main board 400 via the pins 510 and the holes.

Figure 9:
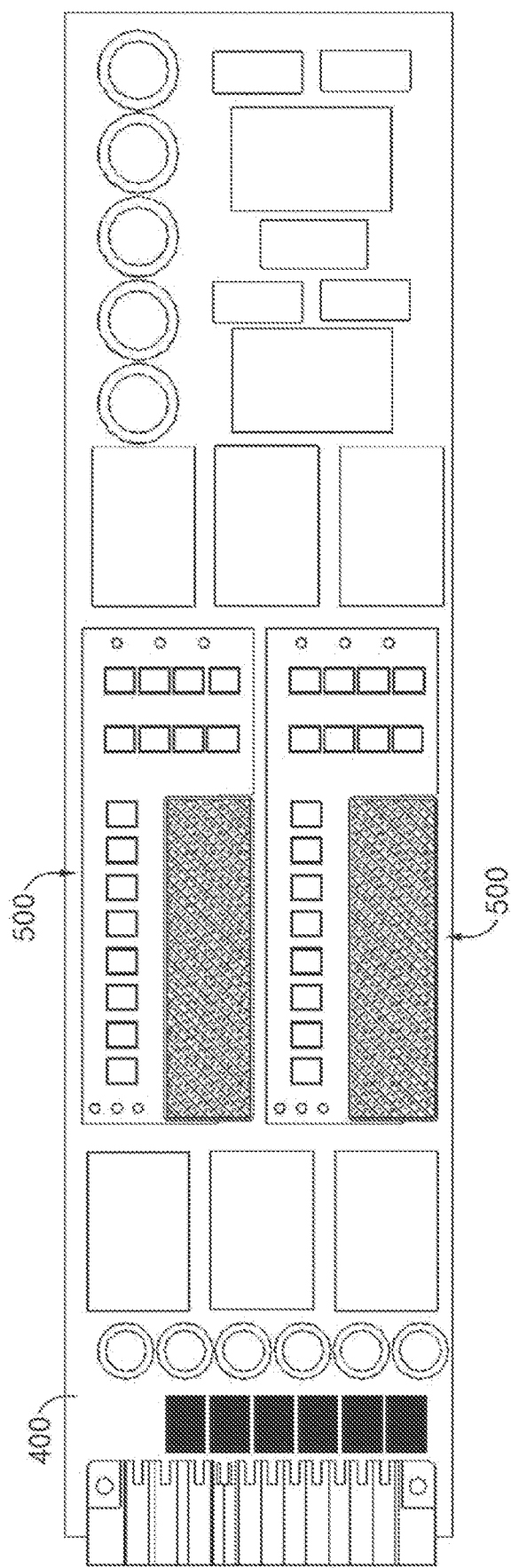
FIG. 9 is a block diagram of the power device according to another exemplary embodiment of the present disclosure.

Referring to FIG. 9, FIG. 9 is a block diagram of the power device according to another exemplary embodiment. As shown in FIG. 9, the power device may include a main board 400 and at least one power module 500. The main power semiconductor component of the power device may be integrated together into the power module 500. FIG. 9 shows two power modules 500. However, the number of the power modules 500 may increase or decrease according to actual requirement. In the present embodiment, the power module 500 may be a power module as shown in FIG. 5. The power module 500 has a plurality of pins 510, which may be perpendicular to the PCB (Referring to FIG. 4). The main board 400 is provided with holes (not shown) for which the pins 510 may insert in. The power module 500 may achieve electrical connection and fixation with the main board 400 via the pins 510 and the holes.

It should be understood that the previous description of the pins may be formed by partial PCB of the PCB. The pins may be a metal pin, but the present disclosure is not limited thereto, determination may depend upon actual requirement.

In the present power module, the core structure of the magnetic element has a first side and a second side opposite to each other, and a third side and a fourth side opposite to each other. The primary winding circuit is positioned in the vicinity of the first side or the second side, the secondary winding circuit is positioned in the vicinity of the third side or the fourth side. That is, the primary winding circuit and the secondary winding circuit are each positioned in the vicinity of two adjacent sides of the core structure, such arrangement is suitable for an architecture that the primary windings are connected in series and the secondary windings are connected in parallel.

The lead direction of the secondary winding in this magnetic element may be easily designed to be oriented towards the secondary winding circuit, which may be directly connected with the secondary winding circuit without being bent, resulting in a significant reduction of the electrical path and trace loss in the secondary winding, thereby the efficiency of the power module and the power device may be improved.

Because the primary winding circuit and the secondary winding circuit are each positioned in the vicinity of two adjacent sides of the core structure, and the core structure does not obstruct the secondary winding circuit, thus the cooling air can cool all of the primary winding circuit, the secondary winding circuit and the magnetic element, and the cooling blind corner may be avoided. Therefore, the power module and the power device according to present disclosure have an excellent thermal conductivity effect.

Figure 10:
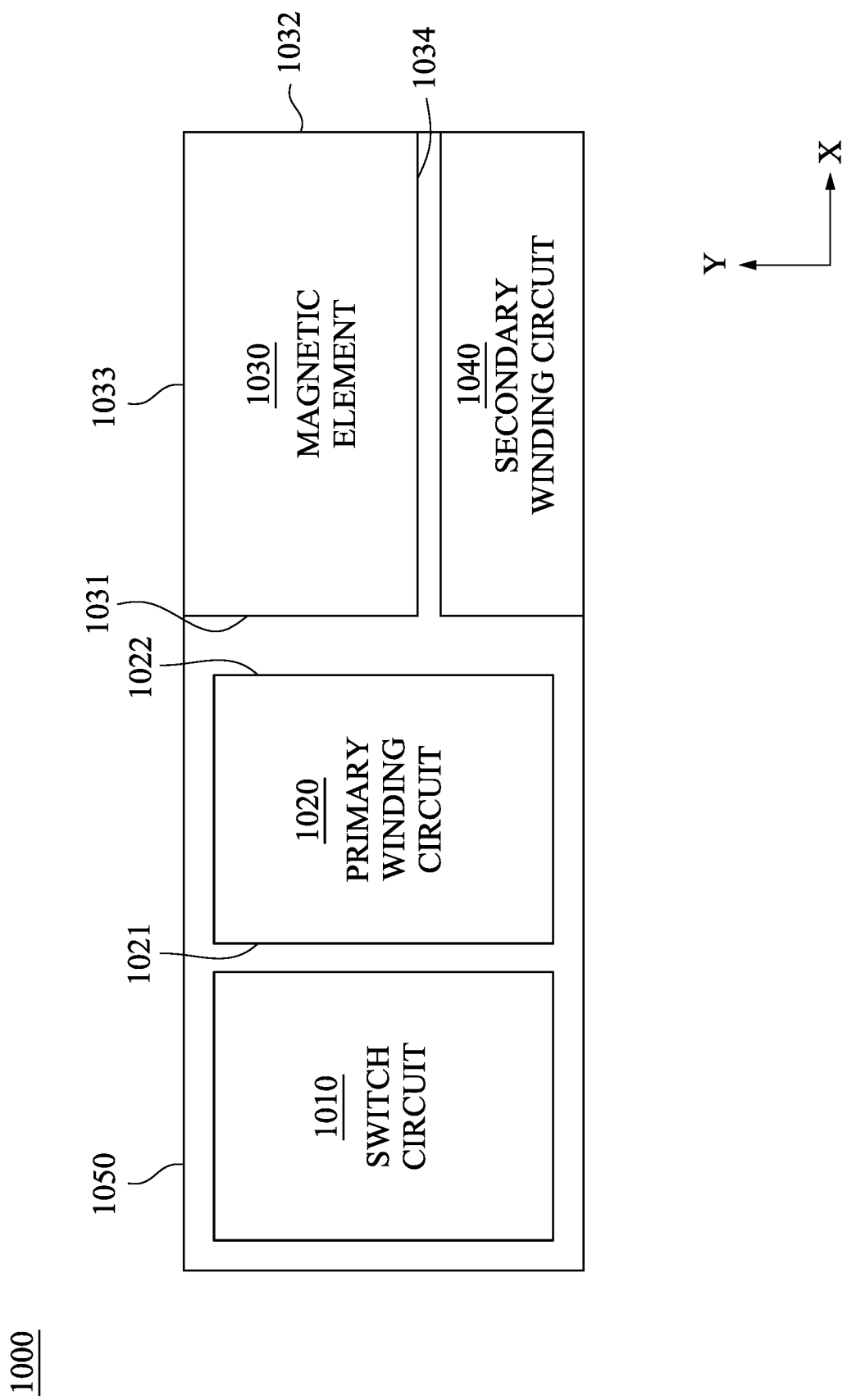
FIG. 10 is a block diagram of a power module according to an exemplary embodiment of the present disclosure.

FIG. 10 is a block diagram of a power module 1000 according to an exemplary embodiment of the present disclosure. The power module 1000 is similar with the power module 500 shown in FIG. 5.

As illustratively shown in FIG. 10, the power module 1000 includes a primary winding circuit 1020, a magnetic element 1030, a secondary winding circuit 1040 and a PCB 1050. The primary winding circuit 1020, the secondary winding circuit 1040 and the PCB 1050 correspond to the primary winding circuit 7, the secondary winding circuit 8 and the PCB 5 shown in FIG. 2, respectively. The magnetic element 1030 corresponds to the magnetic element, the core structure 61, the primary winding 62 and the secondary winding 63 shown in FIG. 2.

As illustratively shown in FIG. 10, a difference between the power module 1000 and the power module 500 is that the power module 1000 further includes a switch circuit 1010. In some embodiments, the switch circuit 1010 is coupled to the primary winding circuit 1020. In some embodiments, the switch circuit 1010 is included in a regulator.

The circuit of the regulator can be a boost circuit or a PFC circuit. The boost circuits 1210 and 1300A-1300C are shown in FIGS. 12, 13A-13C, and the Totem PFC circuits 1300D-1300G are shown in FIGS. 13D-13G. However, the boost circuits or the PFC circuits are not limited to those shown in FIGS. 13A-13G, and can be varied according to the actual operation.

In some embodiments, the switch circuit 1010 includes at least one switch, for example, one of switches S121, S13A1, S13A2, S13B1, S13B2, S13C1-S13C4, S13D1, S13D2, S13E1-S13E4, S13F1-S13F4, S13G1-S13G6, and diodes D121, D13A1, D13A2, D13D1, D13D2, D13F1, D13F2 shown in FIGS. 12, 13A-13G.

As illustratively shown in FIG. 10, the switch circuit 1010, the primary winding circuit 1020, the magnetic element 1030 and the secondary winding circuit 1040 are disposed on the PCB 1050.

As illustratively shown in FIG. 10, the magnetic element 1030 includes four sides 1031-1034. The side 1031 is opposite to the side 1032. The side 1033 is opposite to the side 1034. The primary winding circuit 1020 includes two sides 1021 and 1022. The side 1021 is opposite to the side 1022.

As illustratively shown in FIG. 10, the primary winding circuit 1020 is positioned in a vicinity of the side 1031. The secondary winding circuit 1040 is positioned in a vicinity of the side 1034. The switch circuit 1010 is positioned in a vicinity of the side 1021. The magnetic element 1030 is positioned in a vicinity of the side 1022. In other words, the switch circuit 1010 and the magnetic element 1030 are positioned in two vicinities of two opposite sides 1021 and 1022 of the primary winding circuit 1020, respectively.

Figure 11:
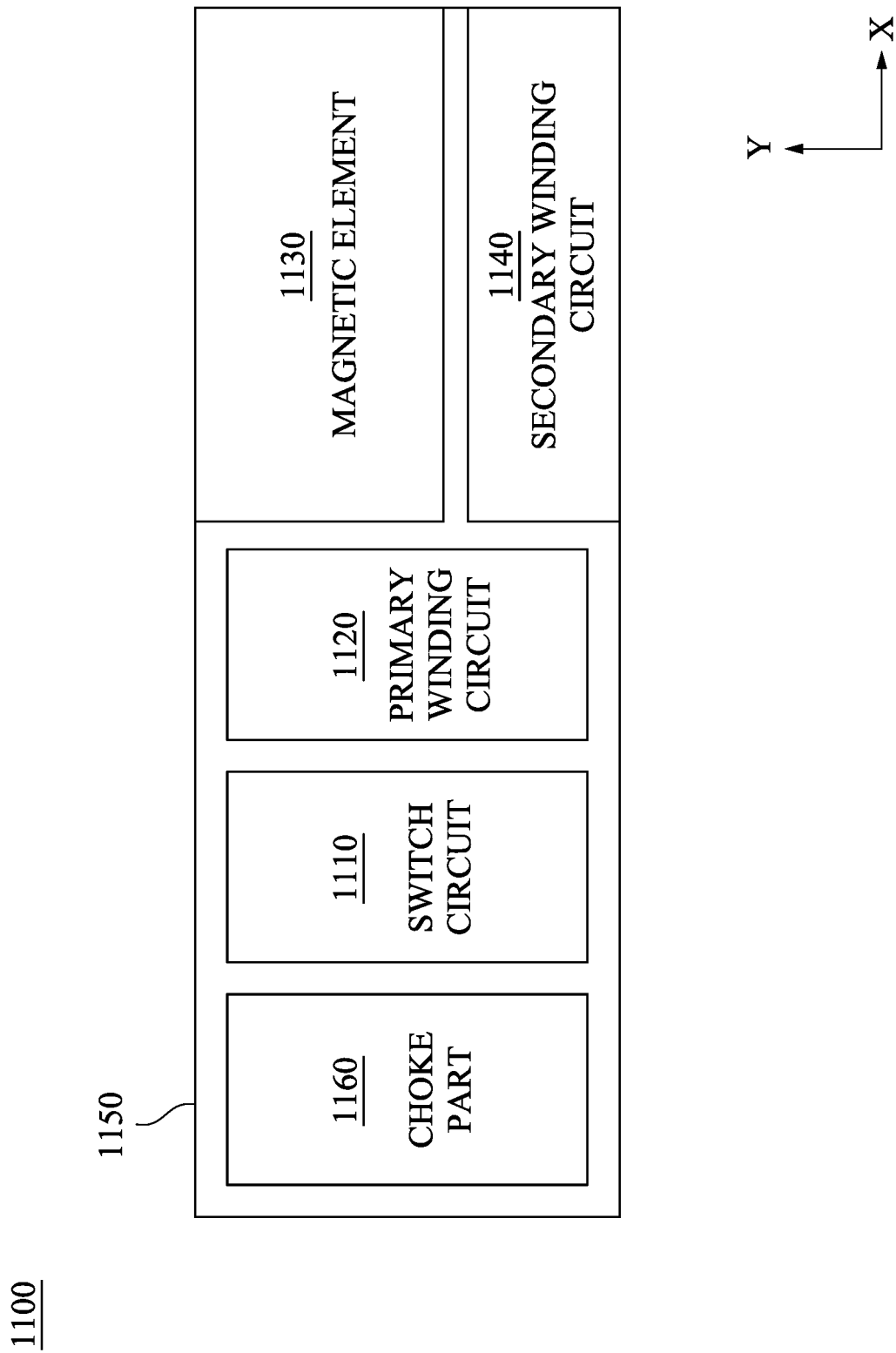
FIG. 11 is a block diagram of a power module according to an exemplary embodiment of the present disclosure.

FIG. 11 is a block diagram of a power module 1100 according to an exemplary embodiment of the present disclosure. The power module 1100 is similar with the power module 1000 shown in FIG. 10. FIG. 11 follows a similar labeling convention to that of FIG. 10. For brevity, the discussion will focus more on differences between FIG. 10 and FIG. 11 than on similarities.

As illustratively shown in FIG. 11, the power module 1100 includes a switch circuit 1110, a primary winding circuit 1120, a magnetic element 1130, a secondary winding circuit 1140 and a PCB 1150. The switch circuit 1110, the primary winding circuit 1120, the magnetic element 1130, the secondary winding circuit 1140 and the PCB 1150 correspond to the switch circuit 1010, the primary winding circuit 1020, the magnetic element 1030, the secondary winding circuit 1040 and the PCB 1050 shown in FIG. 10, respectively.

As illustratively shown in FIG. 11, a difference between the power module 1100 and the power module 1000 is that the power module 1100 further includes a choke part 1160. In some embodiments, the choke part 1160 is coupled to the switch circuit 1110. In some embodiments, the choke part 1160 is included in the regulator. In some embodiments, the choke part 1160 includes at least one choke, for example, one of chokes L121, L13A1, L13A2, L13B1, L13C1, L13C2, L13D1, L13E1, L13F1, L13F2, L13G1 and L13G2 shown in FIGS. 12, 13A-13G. In some embodiments, the choke part 1160 and the switch circuit 1110 are configured to operate as a regulator circuit, for example, the boost circuit or the PFC circuit.

As illustratively shown in FIG. 11, the switch circuit 1110, the primary winding circuit 1120, the magnetic element 1130, the secondary winding circuit 1140 and the choke part 1160 are disposed on the PCB 1150. The choke part 1160, the switch circuit 1110 and the primary winding circuit 1120 are arranged in a first direction (e.g., X-direction shown in FIG. 11) in order. In some embodiments, the first direction is a longitudinal direction of the PCB 1150. In other embodiment, the first direction corresponds a direction from one side of the magnetic element including the primary winding circuit to the opposite side of the magnetic element.

Figure 12:
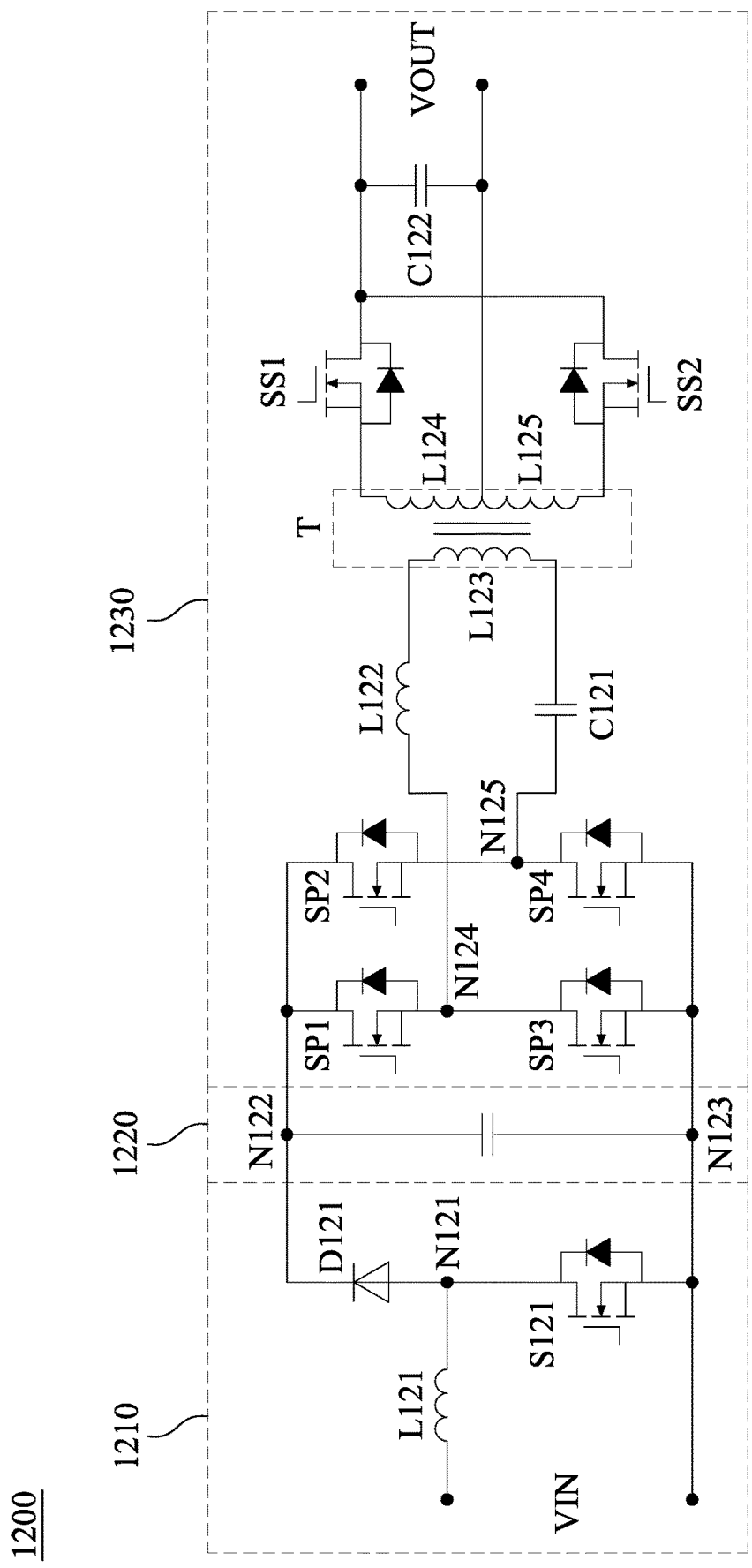
FIG. 12 is a schematic diagram representing the main power circuit of a power device according to an exemplary embodiment of the present disclosure.

FIG. 12 is a schematic diagram representing the main power circuit of a power device according to an exemplary embodiment of the present disclosure. In some embodiments, the schematic diagram 1200 is configured to convert a voltage VIN to a voltage VOUT. In FIG. 12, the voltage VIN is, but not limited to, a DC voltage. In some embodiment, the voltage VIN is an AC voltage.

As illustratively shown in FIG. 12, the schematic diagram 1200 includes a regulator circuit 1210, a bulk capacitor 1220 and a DC/DC converter 1230. In various embodiments, the boost 1210 is implemented by the switch circuits 1110, 1010 and the choke part 1160 shown in FIGS. 10-11. The DC-DC converter 1230 is implemented by one or more of the primary winding circuits 7, 1020, 1120, the magnetic elements 1030, 1130 and the secondary winding circuits 8, 1040, 1140.

As illustratively shown in FIG. 12, the bulk capacitor 1220 is coupled in parallel with the regulator circuit 1210 and the DC-DC converter 1230. The regulator circuit 1210 is configured to receive the voltage VIN. The DC-DC converter 1230 is configured to output the voltage VOUT.

As illustratively shown in FIG. 12, the regulator circuit 1210 is a boost circuit and includes a switch S121, a choke L121 and a diode D121. The switch S121 is coupled to the choke L121 and the diode D121 at a node N121. The diode D121 and the switch S121 are coupled to the DC-DC converter 1230 at nodes N122 and N123, respectively.

In various embodiments, the switch S121 is included in the switch circuit 1010 or the switch circuit 1110 shown in FIG. 10 or 11. In some embodiments, the choke L121 is included in the choke part 1160 shown in FIG. 11.

As illustratively shown in FIG. 12, DC-DC converter 1230 includes switches SP1-SP4, SS1, SS2, inductor L122, transformer T and capacitors C121, C122. The switches SP1 and SP2 are coupled to the regulator circuit 1210 and the bulk capacitor 1220 at the node N122. The switches SP3 and SP4 are coupled to the regulator circuit 1210 and the bulk capacitor 1220 at the node N123.

In various embodiments, the switches SP1-SP4 are included in the primary winding circuits 7, 1020 or 1120 shown in FIG. 2, 10 or 11.

As illustratively shown in FIG. 12, the inductor L122, the primary winding of the transformer T and the capacitor C121 are coupled in series. The inductor L122 is coupled to the switches SP3 and SP1 at a node N124. The capacitor C121 is coupled to the switches SP2 and SP4 at a node N125. The secondary winding of the transformer T and the switches SS1, SS2 are coupled in series.

In some embodiments, the inductor L122 and the capacitor C121 are configured to operate as a resonant circuit. The inductor L122 is configured to operate as a resonant inductor of the resonant circuit.

In various embodiments, the inductor L122 and the transformer T are included in the magnetic elements 1030 or 1130 shown in FIG. 10 or 11. The switches SS1, SS2 are included in the secondary winding circuits 8, 1040 or 1140 shown in FIG. 2, 10 or 11.

Figure 13A:
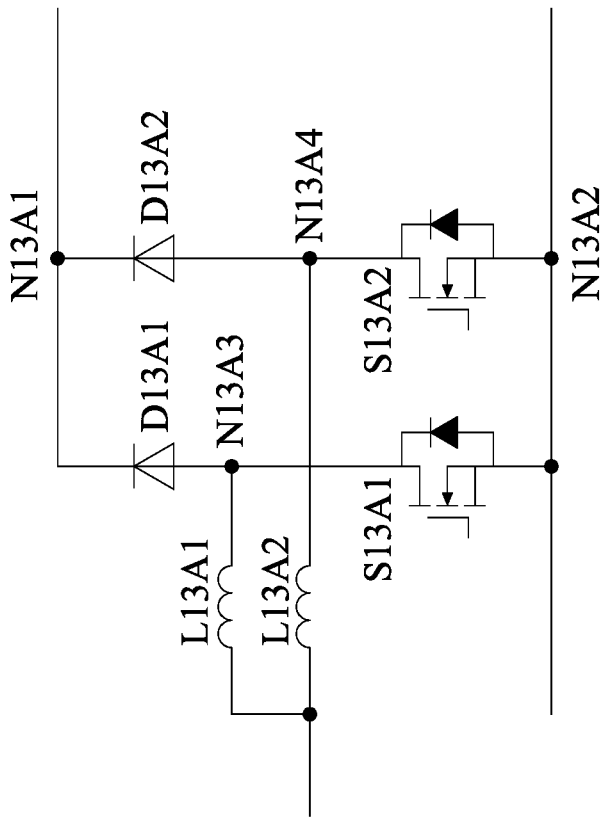
FIGS. 13A-13G are circuit diagrams of different regulator circuits according to an exemplary embodiment of the present disclosure.

FIG. 13A is another circuit diagram of a regulator circuit 1300A according to an exemplary embodiment of the present disclosure. The regulator circuit 1300A is an alternative of the regulator circuit 1210 shown in FIG. 12. In some embodiments, the regulator circuit 1300A is coupled to the DC-DC converter 1230 at nodes N13A1 and N13A2. In some embodiments, the nodes N13A1 and N13A2 are coupled to the nodes N122 and N123, respectively.

As illustratively shown in FIG. 13A, the regulator circuit 1300A is the boost circuit and includes switches S13A1, S13A2, chokes L13A1, L13A2 and diodes D13A1, D13A2. The switches S13A1 and S13A2 are coupled to each other at the node N13A2. The diodes D13A1 and D13A2 are coupled to each other at the node N13A1. The chokes L13A1, L13A2 are coupled in series. The choke L13A1 is coupled to the switch S13A1 and the diode D13A1 at a node N13A3. The choke L13A2 is coupled to the switch S13A2 and the diode D13A2 at a node N13A4.

In various embodiments, the switches S13A1 and S13A2 are included in the switch circuit 1010 or the switch circuit 1110 shown in FIG. 10 or 11. In some embodiments, the chokes L13A1 and L13A2 are included in the choke part 1160 shown in FIG. 11.

Figure 13C:
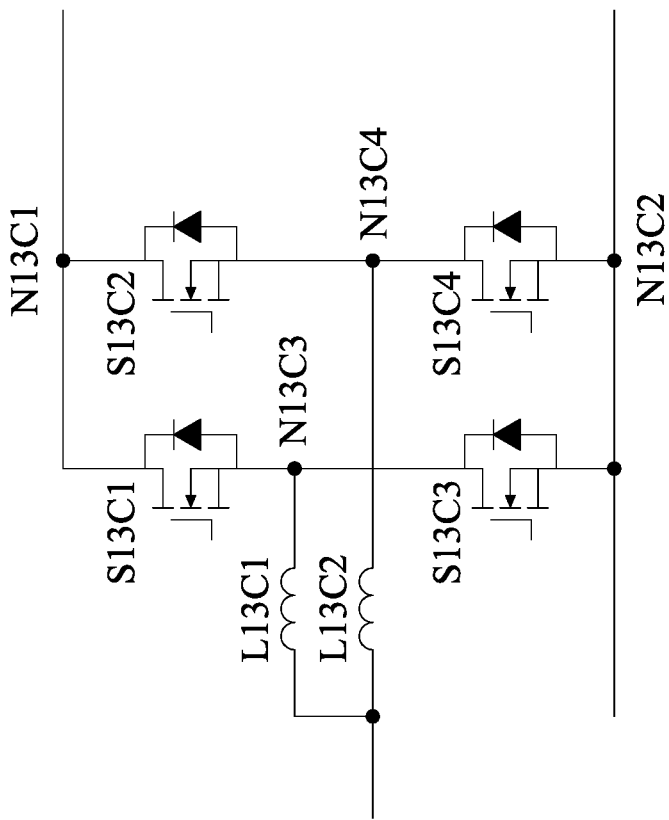
Figure 13B:
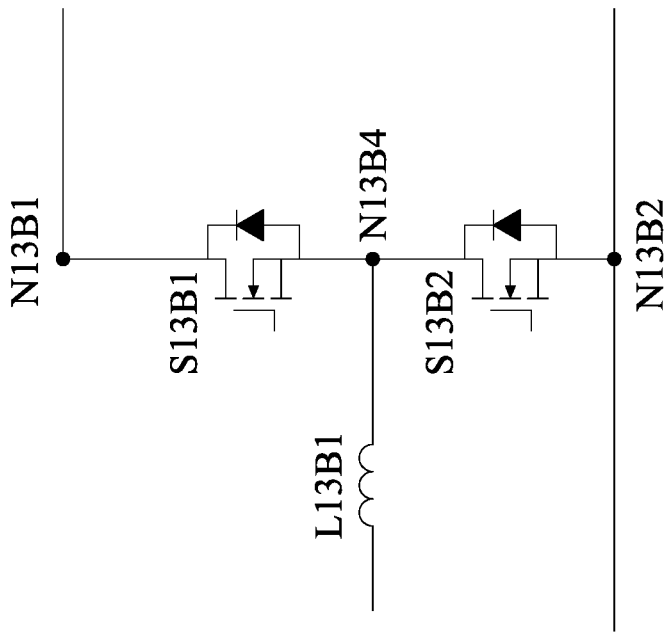

FIG. 13B is another circuit diagram of a regulator circuit 1300B according to an exemplary embodiment of the present disclosure. The regulator circuit 1300B is an alternative of the regulator circuit 1210 shown in FIG. 12. In some embodiments, the regulator circuit 1300B is coupled to the DC-DC converter 1230 at nodes N13B1 and N13B2. In some embodiments, the nodes N13B1 and N13B2 are coupled to the nodes N122 and N123, respectively.

As illustratively shown in FIG. 13B, the regulator circuit 1300B is the boost circuit and includes switches S13B1, S13B2 and a choke L13B1. The switches S13B1, S13B2 and the choke L13B1 are coupled to each other at the node N13B4. The switches S13B1 and S13B2 are coupled to the nodes N13B1 and N13B2, respectively.

In various embodiments, the switches S13B1 and S13B2 are included in the switch circuit 1010 or the switch circuit 1110 shown in FIG. 10 or 11. In some embodiments, the choke L13B1 is included in the choke part 1160 shown in FIG. 11.

FIG. 13C is another circuit diagram of a regulator circuit 1300C according to an exemplary embodiment of the present disclosure. The regulator circuit 1300C is an alternative of the regulator circuit 1210 shown in FIG. 12. In some embodiments, the regulator circuit 1300C is coupled to the DC-DC converter 1230 at nodes N13C1 and N13C2. In some embodiments, the nodes N13C1 and N13C2 are coupled to the nodes N122 and N123, respectively.

As illustratively shown in FIG. 13C, the regulator circuit 1300C is the boost circuit and includes switches S13C1-S13C4 and chokes L13C1, L13C2. The switches S13C1 and S13C2 are coupled to each other at the node N13C1. The switches S13C3 and S13C4 are coupled to each other at the node N13C2. The chokes L13C1, L13C2 are coupled in series. The choke L13C1 is coupled to the switches S13C1 and S13C3 at a node N13C3. The choke L13C2 is coupled to the switches S13C2 and S13C4 at a node N13C4.

In various embodiments, the switches S13C1-S13C4 are included in the switch circuit 1010 or the switch circuit 1110 shown in FIG. 10 or 11. In some embodiments, the chokes L13C1 and L13C2 are included in the choke part 1160 shown in FIG. 11.

Figure 13E:
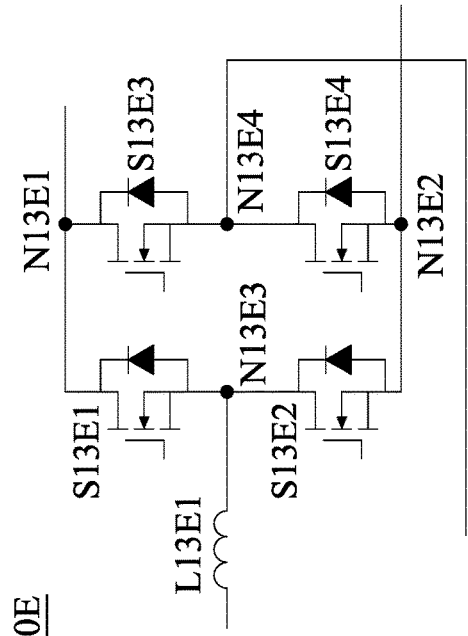
Figure 13G:
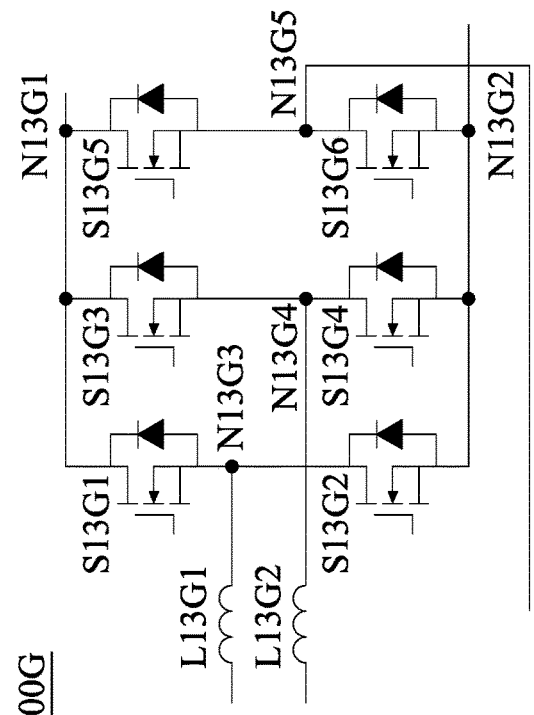
Figure 13D:
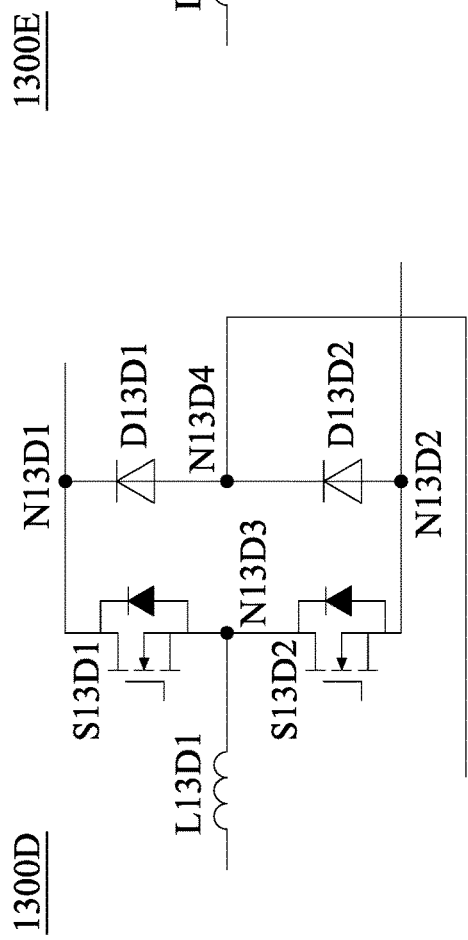

FIG. 13D is another circuit diagram of a regulator circuit 1300D according to an exemplary embodiment of the present disclosure. The regulator circuit 1300D is an alternative of the regulator circuit 1210 shown in FIG. 12. In some embodiments, the regulator circuit 1300D is coupled to the DC-DC converter 1230 at nodes N13D1 and N13D2. In some embodiments, the nodes N13D1 and N13D2 are coupled to the nodes N122 and N123, respectively.

As illustratively shown in FIG. 13D, the regulator circuit 1300D is a totem PFC circuit and includes switches S13D1, S13D2, a choke L13D1 and diodes D13D1, D13D2. The choke L13D1, the switches S13D1 and S13D2 are coupled to each other at a node N13D3. The diodes D13D1 and D13D2 are coupled to each other at a node N13D4. The switch S13D1 is coupled to the diode D13D1 at a node N13D1. The switch S13D2 is coupled to the diode D13D2 at a node N13D2. In some embodiments, the voltage VIN is transmitted into the regulator circuit 1300D from the node N13D4 and the choke L13D1.

In various embodiments, the switches S13D1, S13D2 and the diodes D13D1 and D13D2 are included in the switch circuit 1010 or the switch circuit 1110 shown in FIG. 10 or 11. In some embodiments, the chokes L13D1 is included in the choke part 1160 shown in FIG. 11.

FIG. 13E is another circuit diagram of a regulator circuit 1300E according to an exemplary embodiment of the present disclosure. The regulator circuit 1300E is an alternative of the regulator circuit 1210 shown in FIG. 12. In some embodiments, the regulator circuit 1300E is coupled to the DC-DC converter 1230 at nodes N13E1 and N13E2. In some embodiments, the nodes N13E1 and N13E2 are coupled to the nodes N122 and N123, respectively.

As illustratively shown in FIG. 13E, the regulator circuit 1300E is a totem PFC circuit and includes switches S13E1-S13E4 and a choke L13E1. The choke L13E1, the switches S13E1 and S13E2 are coupled to each other at a node N13E3. The switches S13E3 and S13E4 are coupled to each other at a node N13E4. The switch S13E1 is coupled to the switch S13E3 at a node N13E1. The switch S13E2 is coupled to the switch S13E4 at a node N13E2. In some embodiments, the voltage VIN is transmitted into the regulator circuit 1300E from the node N13E4 and the choke L13E1.

In various embodiments, the switches S13E1-S13E4 are included in the switch circuit 1010 or the switch circuit 1110 shown in FIG. 10 or 11. In some embodiments, the chokes L13E1 is included in the choke part 1160 shown in FIG. 11.

Figure 13F:
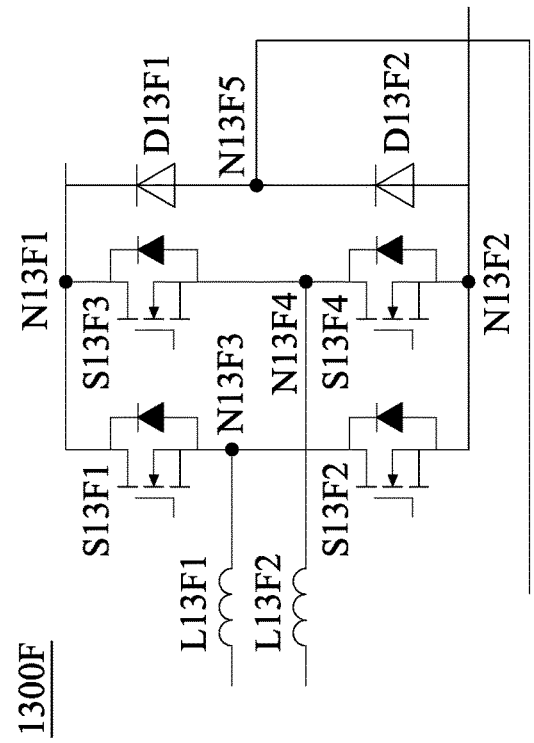

FIG. 13F is another circuit diagram of a regulator circuit 1300F according to an exemplary embodiment of the present disclosure. The regulator circuit 1300F is an alternative of the regulator circuit 1210 shown in FIG. 12. In some embodiments, the regulator circuit 1300F is coupled to the DC-DC converter 1230 at nodes N13F1 and N13F2. In some embodiments, the nodes N13F1 and N13F2 are coupled to the nodes N122 and N123, respectively.

As illustratively shown in FIG. 13F, the regulator circuit 1300F is a totem PFC circuit and includes switches S13F1-S13F4, diodes D13F1, D13F2 and chokes L13F1, L13F2. The choke L13F1, the switches S13F1 and S13F2 are coupled to each other at a node N13F3. The choke L13F2, the switches S13F3 and S13F4 are coupled to each other at a node N13F4. The diode D13F1, the switches S13F1 and S13F3 are coupled to each other at the node N13F1. The diode D13F2, the switches S13F2 and S13F4 are coupled to each other at the node N13F2. The diodes D13F1, D13F2 are coupled to each other at a node N13F5. In some embodiments, the voltage VIN is transmitted into the regulator circuit 1300F from the node N13F5 and the chokes L13F1, L13F2.

In various embodiments, the switches S13F1-S13F4 and the diodes D13F1, D13F2 are included in the switch circuit 1010 or the switch circuit 1110 shown in FIG. 10 or 11. In some embodiments, the chokes L13F1 and L13F2 are included in the choke part 1160 shown in FIG. 11.

FIG. 13G is another circuit diagram of a regulator circuit 1300G according to an exemplary embodiment of the present disclosure. The regulator circuit 1300G is an alternative of the regulator circuit 1210 shown in FIG. 12. In some embodiments, the regulator circuit 1300G is coupled to the DC-DC converter 1230 at nodes N13G1 and N13G2. In some embodiments, the nodes N13G1 and N13G2 are coupled to the nodes N122 and N123, respectively.

As illustratively shown in FIG. 13G, the regulator circuit 1300G is a totem PFC circuit and includes switches S13G1-S13G6 and chokes L13G1, L13G2. The choke L13G1, the switches S13G1 and S13G2 are coupled to each other at a node N13G3. The choke L13G2, the switches S13G3 and S13G4 are coupled to each other at a node N13G4. The switch S13G5, S13G1 and S13G3 are coupled to each other at the node N13G1. The switch S13G6, S13G2 and S13G4 are coupled to each other at the node N13G2. The switches S13G5, S13G6 are coupled to each other at a node N13G5. In some embodiments, the voltage VIN is transmitted into the regulator circuit 1300G from the node N13G5 and the chokes L13G1, L13G2.

In various embodiments, the switches S13G1-S13G6 are included in the switch circuit 1010 or the switch circuit 1110 shown in FIG. 10 or 11. In some embodiments, the chokes L13G1 and L13G2 are included in the choke part 1160 shown in FIG. 11.

Figures 14A, 14B:
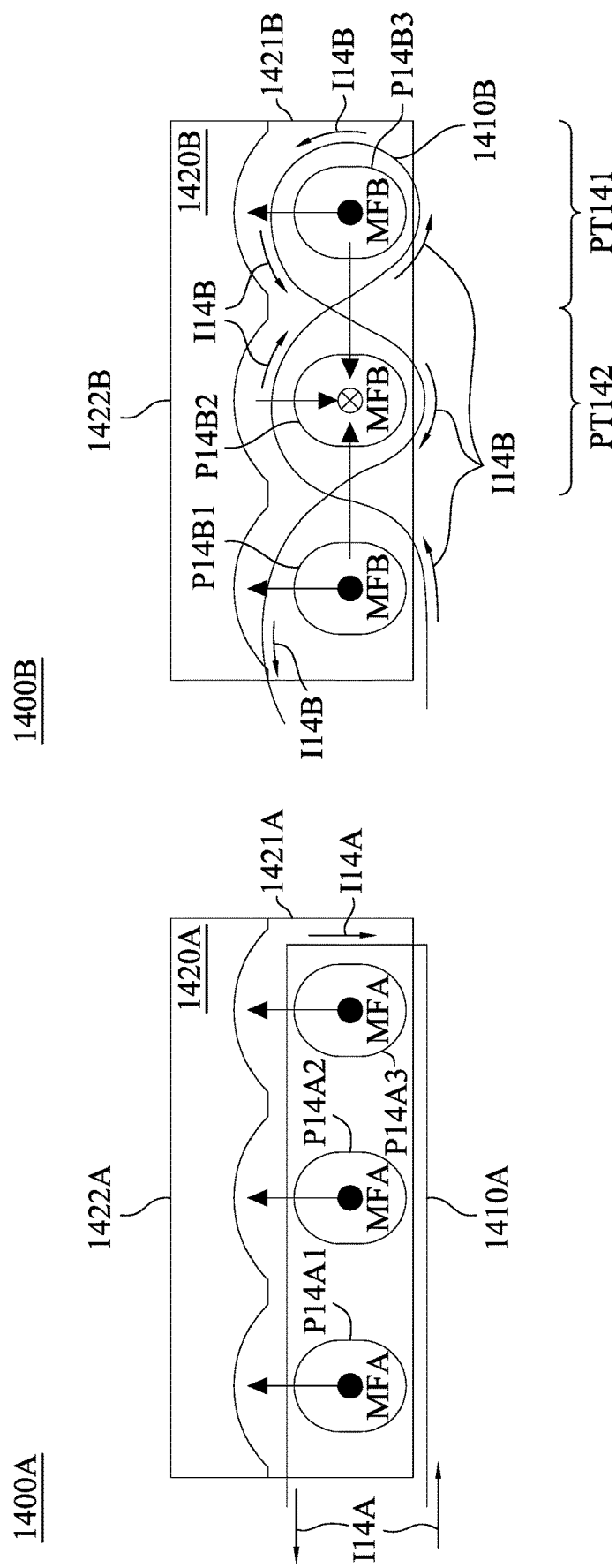
FIG. 14A is a block diagram of a magnetic element according to an exemplary embodiment of the present disclosure.
FIG. 14B is a block diagram of a magnetic element according to an exemplary embodiment of the present disclosure.

FIG. 14A is a block diagram of a magnetic element according to an exemplary embodiment of the present disclosure. As illustratively shown in FIG. 14A, a magnetic element 1400A includes a primary winding 1410A and a core structure 1420A. The primary winding 1410A is an embodiment of the primary winding 62 shown in FIG. 2 and FIG. 3. The core structure 1420A is an embodiment of the core structure 61 shown in FIG. 2 and FIG. 3.

In some embodiments, the primary winding 1410A is coupled to a primary winding circuit, such as the primary winding circuit 7 shown in FIGS. 2-5.

As illustratively shown in FIG. 14A, the core structure 1420A includes magnetic cover 1421A, a common side pole 1422A and three winding poles P14A1-P14A3. The magnetic cover 1421A is an embodiment of the first magnetic cover 65 shown in FIG. 3. The common side pole 1422A is an embodiment of the common side pole 68 shown in FIG. 3. The winding poles P14A1-P14A3 are embodiment of the inductor magnetic pole 69 and the transformer magnetic pole 67 shown in FIGS. 6, 7. The number of the magnetic poles included in the core structure 1420A is not limited to three. Other numbers of magnetic poles are within the contemplated scope of the present disclosure.

As illustratively shown in FIG. 14A, the common side pole 1422A and the winding poles P14A1-P14A3 are disposed on the magnetic cover 1421A, and the winding poles P14A1-P14A3 are opposite to the common side pole 1422A. The primary winding 1410A surrounds all the winding poles P14A1-P14A3.

In some embodiments, a current I14A flows through the primary winding 1410A. In a view of the winding poles P14A1-P14A3, the current I14A flows clockwise, such that magnetic fluxes MFA passing through the winding poles P14A1-P14A3 have same directions.

FIG. 14B is a block diagram of a magnetic element according to an exemplary embodiment of the present disclosure. As illustratively shown in FIG. 14B, a magnetic element 1400B includes a primary winding 1410B and a core structure 1420B. The magnetic element 1400B is similar with the magnetic element 1400A shown in FIG. 14A. For brevity, the discussion will focus more on differences between the magnetic elements 1400A and 1400B than on similarities.

As illustratively shown in FIG. 14B, the core structure 1420B includes magnetic cover 1421B, a common side pole 1422B and three winding poles P14B1-P14B3. The configuration of the common side pole 1422B and the winding poles P14B1-P14B3 is similar with the common side pole 1422A and the winding poles P14A1-P14A3 shown in FIG. 14A.

The differences between the magnetic elements 1400A and 1400B include that the primary winding 1410B includes portions PT141 and PT142. As illustratively shown in FIG. 14B, the portions PT141 and PT142 surrounds the winding poles P14B3 and P14B2, respectively. The portions PT141 and PT142 forms a ∞ shape. For example, when the current I14B flows clockwise in the portion PT142, the current I14B flows anticlockwise in the portion PT141. As results, magnetic fluxes MFB passing through the winding poles P14B3 and P14B2 have different directions.

Comparing to some previous approaches, according to the embodiment of the present disclosure shown in FIG. 14B, the arrangement of the primary winding 1410B causes the magnetic fluxes of the magnetic cover 1421B evenly distributed, such that the core loss of the magnetic cover 1421B is reduced.

Figure 15:
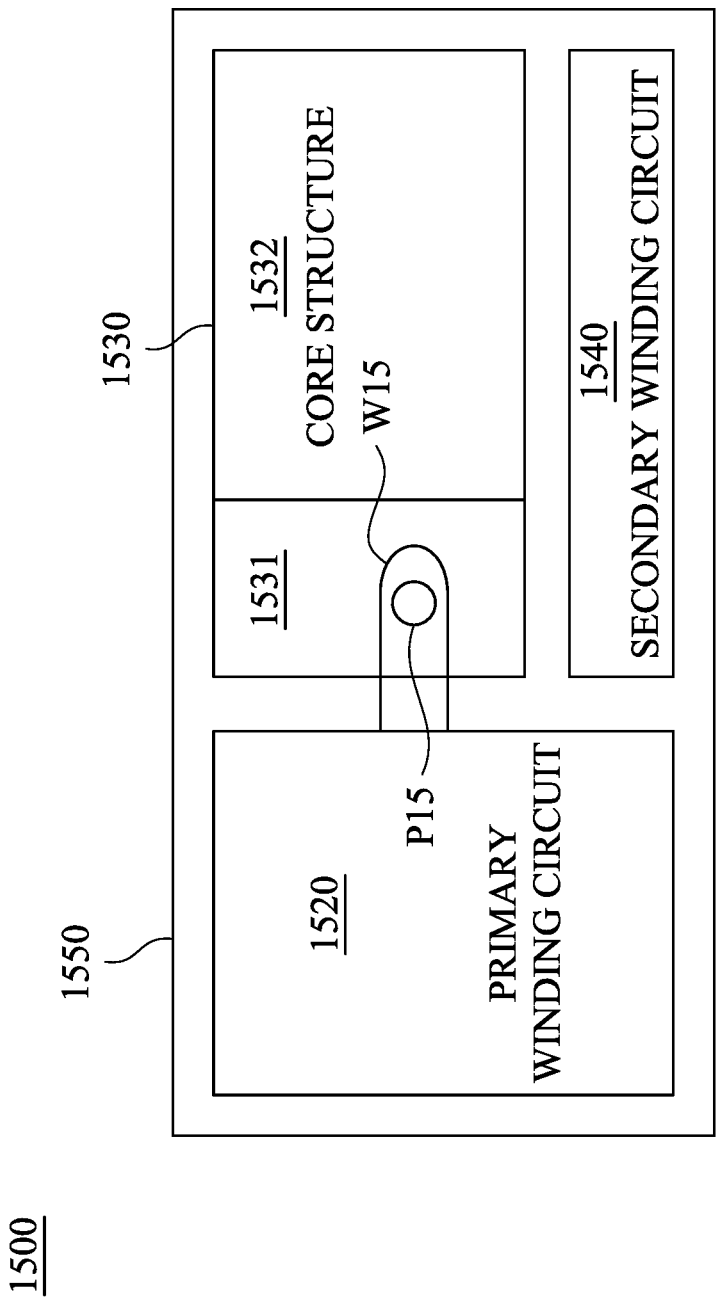
FIG. 15 is a block diagram of a power module according to an exemplary embodiment of the present disclosure.

FIG. 15 is a block diagram of a power module 1500 according to an exemplary embodiment of the present disclosure. The power module 1500 is an embodiment of one of the power modules 500, 1000, 1100 shown in FIGS. 5, 10, 11.

As illustratively shown in FIG. 15, the power module 1500 includes a primary winding circuit 1520, a magnetic element 1530, a secondary winding circuit 1540 and a PCB 1550. The primary winding circuit 1520, the magnetic element 1530 and the secondary winding circuit 1540 are disposed on the PCB 1550.

As illustratively shown in FIG. 15, the magnetic element 1530 includes core structures 1531 and 1532. The core structure 1531 is arranged between the core structure 1532 and the primary winding circuit 1520.

As illustratively shown in FIG. 15, the core structure 1531 includes an inductor winding pole P15 and an inductor winding W15. The inductor winding pole P15 is an embodiment of the inductor magnetic pole 69 shown in FIG. 6. The inductor winding W15 is an embodiment of a portion of the primary windings 62, 1410A or 1410B shown in FIG. 3, 14A or 14B.

In some embodiments, the inductor winding W15 surrounds around the inductor winding pole P15 to form an inductor, such as the inductor L122 included in the resonant network shown in FIG. 12. In some embodiments, the inductor winding pole P15 is coupled to the primary winding circuit 1520. In some embodiments, the core structure 1531 further includes an inductor magnetic cover (not shown), and the inductor winding pole P15 is disposed on the inductor magnetic cover.

On the other hand, the core structure 1532 includes a transformer magnetic cover (not shown), a transformer winding pole and a transformer winding. The transformer winding pole is an embodiment of the transformer magnetic pole 67 shown in FIG. 6. The transformer winding includes a portion of the primary windings 62, 1410A or 1410B shown in FIG. 3, 14A or 14B and the secondary winding 63 shown in FIG. 3. In some embodiments, the transformer winding surrounds around the transformer winding pole to form a transformer, such as the transformer T.

In some embodiments, the inductor magnetic cover and the transformer magnetic cover are separated with each other. The shape of the inductor magnetic cover and the transformer magnetic cover can be similar with or different from the magnetic cover shown in FIGS. 2-7.

Comparing to some previous approaches, according to the embodiment of the present disclosure shown in FIG. 15, the arrangement of the core structures 1531 and 1532 facilitates to control a gap between the inductor L122 and the transformer, and improves a utilization of the PCB 1550 of the power module 1500.

Figure 16A:
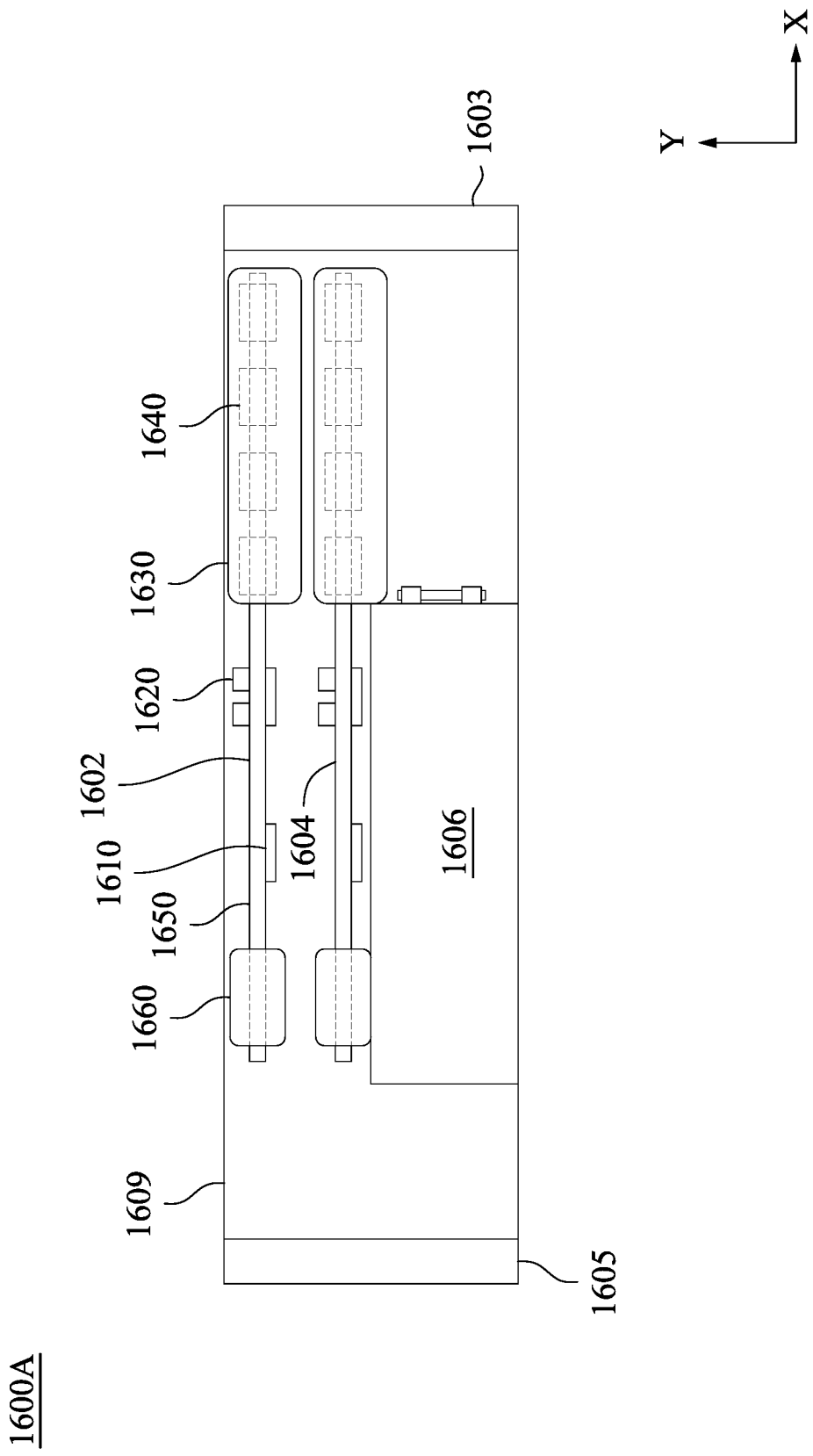
FIGS. 16A, 16B, 17A-17C and 18A-18D are block diagrams of different power devices according to exemplary embodiments of the present disclosure.

FIG. 16A is a block diagram of a power device 1600A according to an exemplary embodiment of the present disclosure. The power device 1600A is an alternative of the power devices shown in FIGS. 8 and 9.

As illustratively shown in FIG. 16A, the power device 1600A includes power modules 1602, 1604, a bulk capacitor 1606, and a mainboard 1609. The power modules 1602, 1604 are embodiments of the power module 1100 shown in FIG. 11. The bulk capacitor 1606 is an embodiment of the bulk capacitor 1220 shown in FIG. 12.

As illustratively shown in FIG. 16A, the power modules 1602, 1604 and the bulk capacitor 1606 are disposed on the mainboard 1609. In some embodiments, the power device 1600A further includes an input terminal 1605 and an output terminal 1603 which are coupled to the power modules 1602 and 1604.

It is noted that the number of power modules is not limited to two, other numbers of the power modules are within the contemplated scope of the present disclosure.

As illustratively shown in FIG. 16A, the power module 1602 includes a switch circuit 1610, a primary winding circuit 1620, a magnetic element 1630, a secondary winding circuit 1640, a PCB 1650 and a choke part 1660. The switch circuit 1610, the primary winding circuit 1620, the magnetic element 1630, the secondary winding circuit 1640, the PCB 1650 and the choke part 1660 correspond to the switch circuit 1110, the primary winding circuit 1120, the magnetic element 1130, the secondary winding circuit 1140, the PCB 1150 and the choke part 1160 shown in FIG. 11, respectively. The switch circuit 1610, the primary winding circuit 1620, the magnetic element 1630, the secondary winding circuit 1640 and the choke part 1660 are disposed on the PCB 1650.

In some embodiments, an X-direction is defined by the direction from the input terminal 1605 to the output terminal 1603 of the power device 1600A. The PCB 1650 is disposed on the mainboard 1609 such that the primary winding circuit 1620 and the magnetic element 1630 are arranged in the X-direction in order. In other word, the PCB 1650 is disposed on the mainboard 1609 with the first direction of the PCB 1650 corresponding to the X-direction from an input terminal 1605 to the output terminal 1603 of the power device 1600A.

In various embodiments, the switch circuit 1610 includes at least one of the switches S121, S13A1, S13A2, S13B1, S13B2, S13C1-S13C4, S13D1, S13D2, S13E1-S13E4, S13F1-S13F4, S13G1-S13G6, and the diodes D121, D13A1, D13A2, D13D1, D13D2, D13F1, D13F2 shown in FIGS. 12, 13A-13G. In various embodiments, the choke part 1660 include at least one of the chokes L121, L13A1, L13A2, L13B1, L13C1, L13C2, L13D1, L13E1, L13F1, L13F2, L13G1 and L13G2 shown in FIGS. 12, 13A-13G.

In some embodiments, the power module 1604 is arranged beside the power module 1602. The power module 1604 is similar with the power module 1602, and thus details of the power module 1604 are not described herein for brevity. In some other embodiments, the power module 1604 is different with the power module 1602.

As illustratively shown in FIG. 16A, the bulk capacitor 1606 is disposed on the mainboard, and arranged with the PCB 1650 in a Y-direction orthogonal to the X-direction. In other words, the bulk capacitor 1606 arranged with the power modules 1602 and 1604 in the Y-direction.

In some embodiments, the power device 1600A can operate when it is immersed in a liquid, in which the liquid can bring the heat of the power device 1600A and cool the power device 1600A.

Figure 16B:
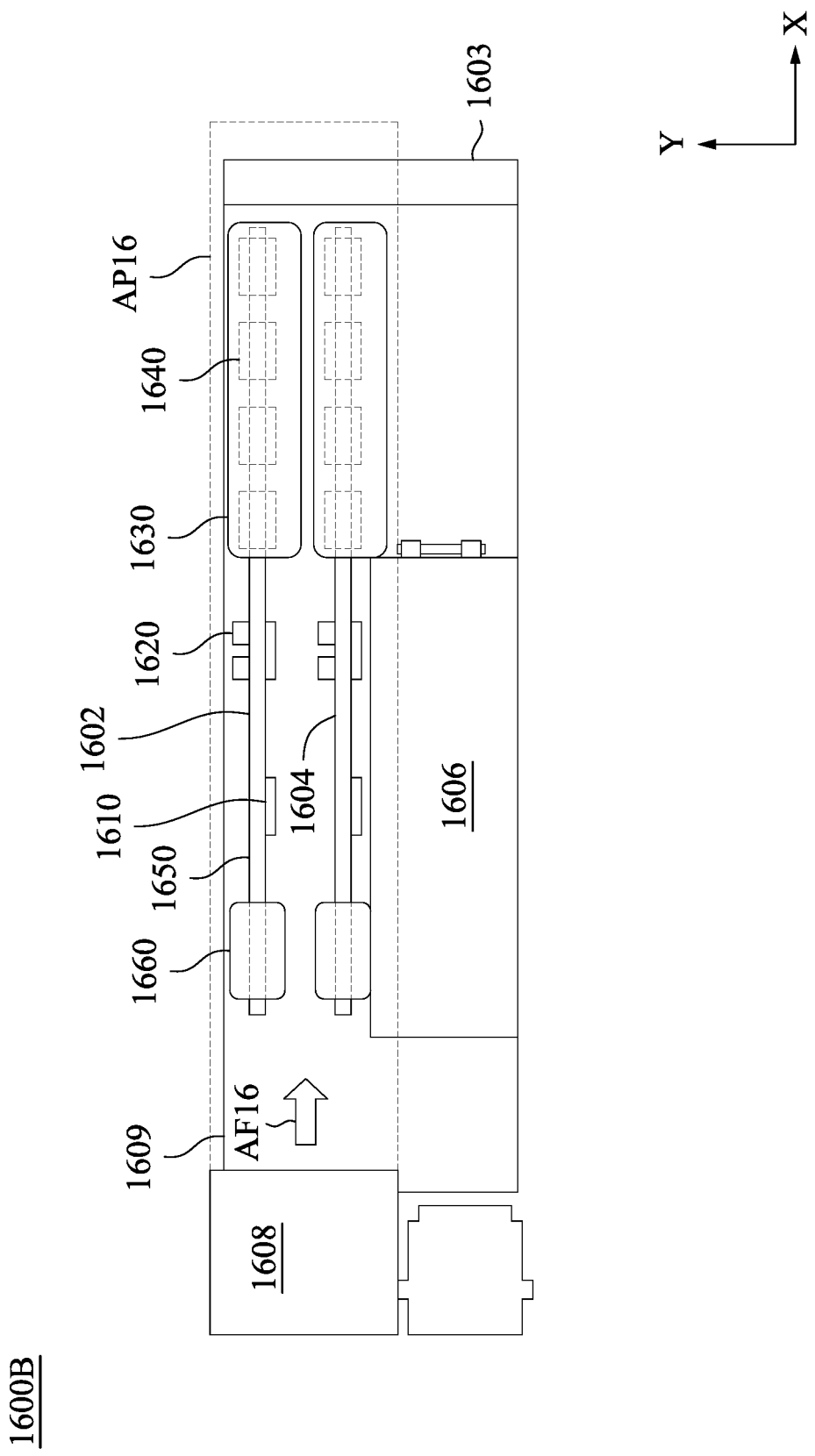

In other embodiments, the power device further includes a fan to cool the power device 1600A. As illustratively shown in FIG. 16B with reference to FIG. 16A, comparing to the power device 1600A, the power device 1600B further includes a fan 1608. The fan 1608 is attached to the mainboard 1609 at an end of the mainboard 1609 in X-direction. The fan 1608 is configured to generate an airflow AF16 flowing in an X-direction and an air passage AP16 is formed due to the airflow AF16. According to the layout described above of the power device 1600B, the power modules 1602 and 1604 are disposed in the air passage AP16, and the bulk capacitor 1606 does not hinder the airflow AF16 flowing by the power modules 1602 and 1604, and thereby better thermal conductivity can be realized.

Figure 17A:
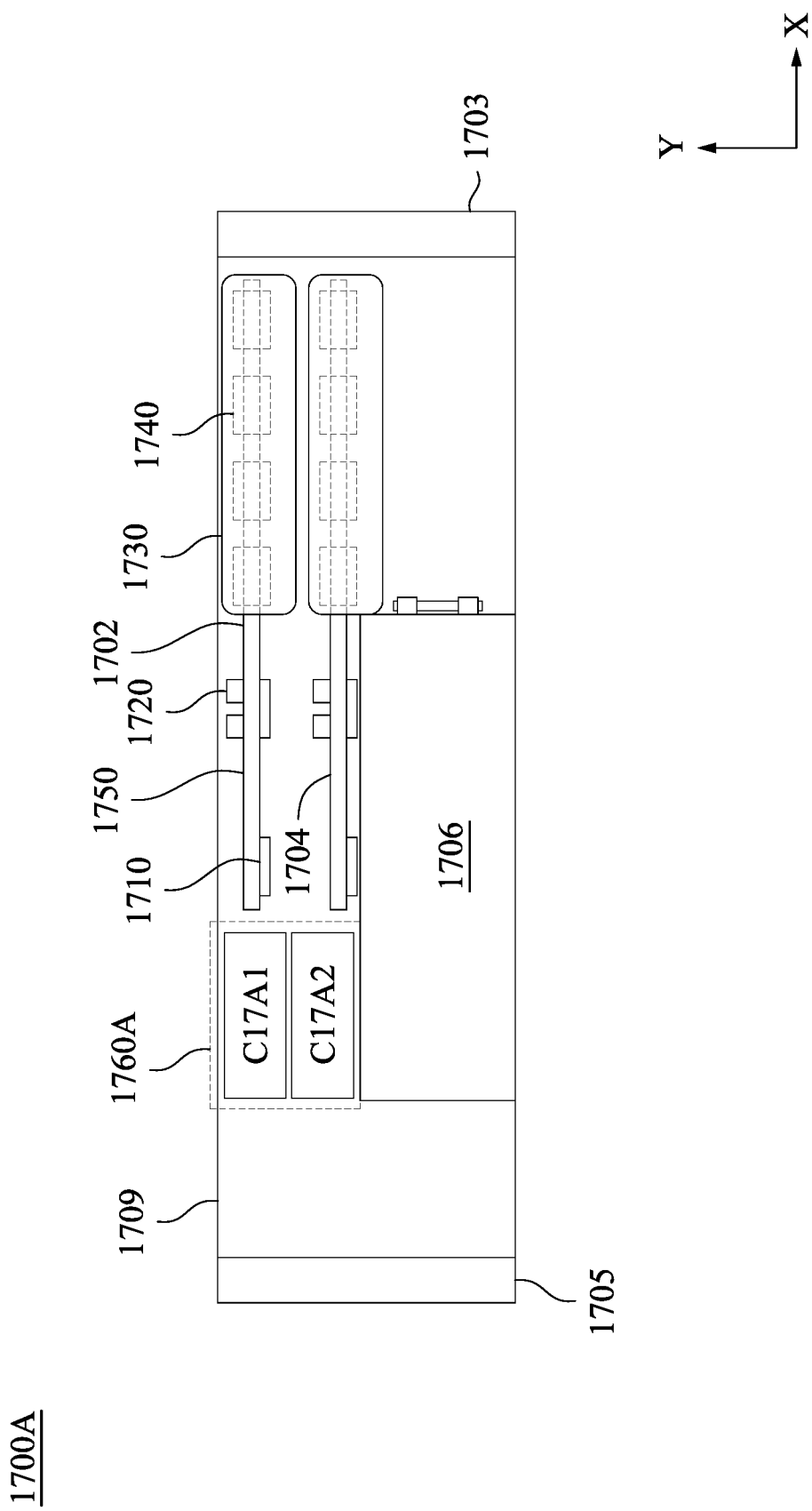

FIG. 17A is a block diagram of a power device 1700A according to an exemplary embodiment of the present disclosure. The power device 1700A is an alternative of the power devices shown in FIGS. 8 and 9.

As illustratively shown in FIG. 17A, the power device 1700A includes power modules 1702, 1704, a bulk capacitor 1706, a choke part 1760A and a mainboard 1709. The power modules 1702, 1704 are embodiments of the power module 1000 shown in FIG. 10. The bulk capacitor 1706 is an embodiment of the bulk capacitor 1220 shown in FIG. 12.

As illustratively shown in FIG. 17A, the choke part 1760A, the power modules 1702, 1704 and the bulk capacitor 1706 are disposed on the mainboard 1709. In some embodiments, the power device 1700A further includes an input terminal 1705 and an output terminal 1703 which are coupled to the power modules 1702 and 1704.

As illustratively shown in FIG. 17A, the choke part 1760A and the power modules 1702 or 1704 are disposed in the mainboard along the X-direction in order. It is noted that the number of power modules is not limited to two, other numbers of the power modules are within the contemplated scope of the present disclosure.

As illustratively shown in FIG. 17A, the power module 1702 includes a switch circuit 1710, a primary winding circuit 1720, a magnetic element 1730, a secondary winding circuit 1740 and a PCB 1750. The switch circuit 1710, the primary winding circuit 1720, the magnetic element 1730, the secondary winding circuit 1740 and the PCB 1750 correspond to the switch circuit 1010, the primary winding circuit 1020, the magnetic element 1030, the secondary winding circuit 1040 and the PCB 1050 shown in FIG. 10, respectively. The switch circuit 1710, the primary winding circuit 1720, the magnetic element 1730 and the secondary winding circuit 1740 are disposed on the PCB 1750. In some embodiments, the X-direction is defined by the direction from the input terminal 1705 to the output terminal 1703 of the power device 1700A. The PCB 1750 is disposed on the mainboard 1709 such that the primary winding circuit 1720 and the magnetic element 1730 are arranged in the X-direction in order. In other word, the PCB 1750 is disposed on the mainboard 1709 with the first direction of the PCB 1750 corresponding to the X-direction from the input terminal 1705 to the output terminal 1703 of the power device 1700A.

In various embodiments, the switch circuit 1710 includes at least one of the switches S121, S13A1, S13A2, S13B1, S13B2, S13C1-S13C4, S13D1, S13D2, S13E1-S13E4, S13F1-S13F4, S13G1-S13G6, and the diodes D121, D13A1, D13A2, D13D1, D13D2, D13F1, D13F2 shown in FIGS. 12, 13A-13G.

As illustratively shown in FIG. 17A, the choke part 1760A includes chokes C17A1 and C17A2. In some embodiments, the chokes C17A1 and C17A2 are traditional winding chokes.

In various embodiments, at least one of the chokes L121, L13A1 and L13A2 shown in FIGS. 12-13 are implemented by at least one of the chokes C17A1 and C17A2. For example, the choke C17A1 is configured to operate as the choke L121 and coupled to the switch S121, D121 included in the switch circuit 1710 in some embodiments. In various embodiments, the choke C17A1 is configured to operate as at least one of the chokes L121, L13A1, L13A2, L13B1, L13C1, L13C2, L13D1, L13E1, L13F1, L13F2, L13G1 and L13G2, and coupled to at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 as shown in FIGS. 12, 13A-13G. The number of the chokes included in the choke part 1760A is not limited to two. Other numbers of chokes are within the contemplated scope of the present disclosure.

In some embodiments, the power module 1704 is arranged beside the power module 1702. In some embodiments, the choke C17A2 is coupled to a switch circuit included in the power module 1704. The power module 1704 is similar with the power module 1702, and thus details of the power module 1704 are not described herein for brevity. In some other embodiments, the power module 1704 is different with the power module 1702.

As illustratively shown in FIG. 17A, the bulk capacitor 1706 is disposed on the mainboard, and arranged with the PCB 1750 in a Y-direction orthogonal to the X-direction. In other words, the bulk capacitor 1706 arranged with the power modules 1702, 1704 and the choke part 1760A in the Y-direction.

In some embodiments, the power device 1700A can operate when it is immersed in a liquid, in which the liquid can bring the heat of the power device 1700A and cool the power device 1700A.

In other embodiments, the power device further includes a fan to cool the power device 1700A. As illustratively shown in FIG. 17C with reference to FIG. 17A, comparing to the power device 1700A, the power device 1700C further includes a fan 1708. The fan 1708 is attached to the mainboard 1709 at an end of the mainboard 1709 in the X-direction. The fan 1708 is configured to generate an airflow AF17 flowing in an X-direction. An air passage AP17 is formed due to the airflow AF17. The choke part 1760C and the power modules 1702, 1704 are disposed in the air passage AP17. The choke part 1760C is disposed on the mainboard 1709 and arranged between the power modules 1702, 1704 and the fan 1708 in the X-direction. According to the arrangement of the choke part 1760C, the power modules 1702, 1704, the fan 1708 and the bulk capacitor 1706, the bulk capacitor 1706 does not hinder the airflow AF17 flowing by the power modules 1702, 1704 and the choke part 1760C, and thereby better thermal conductivity can be realized.

Figure 17B:
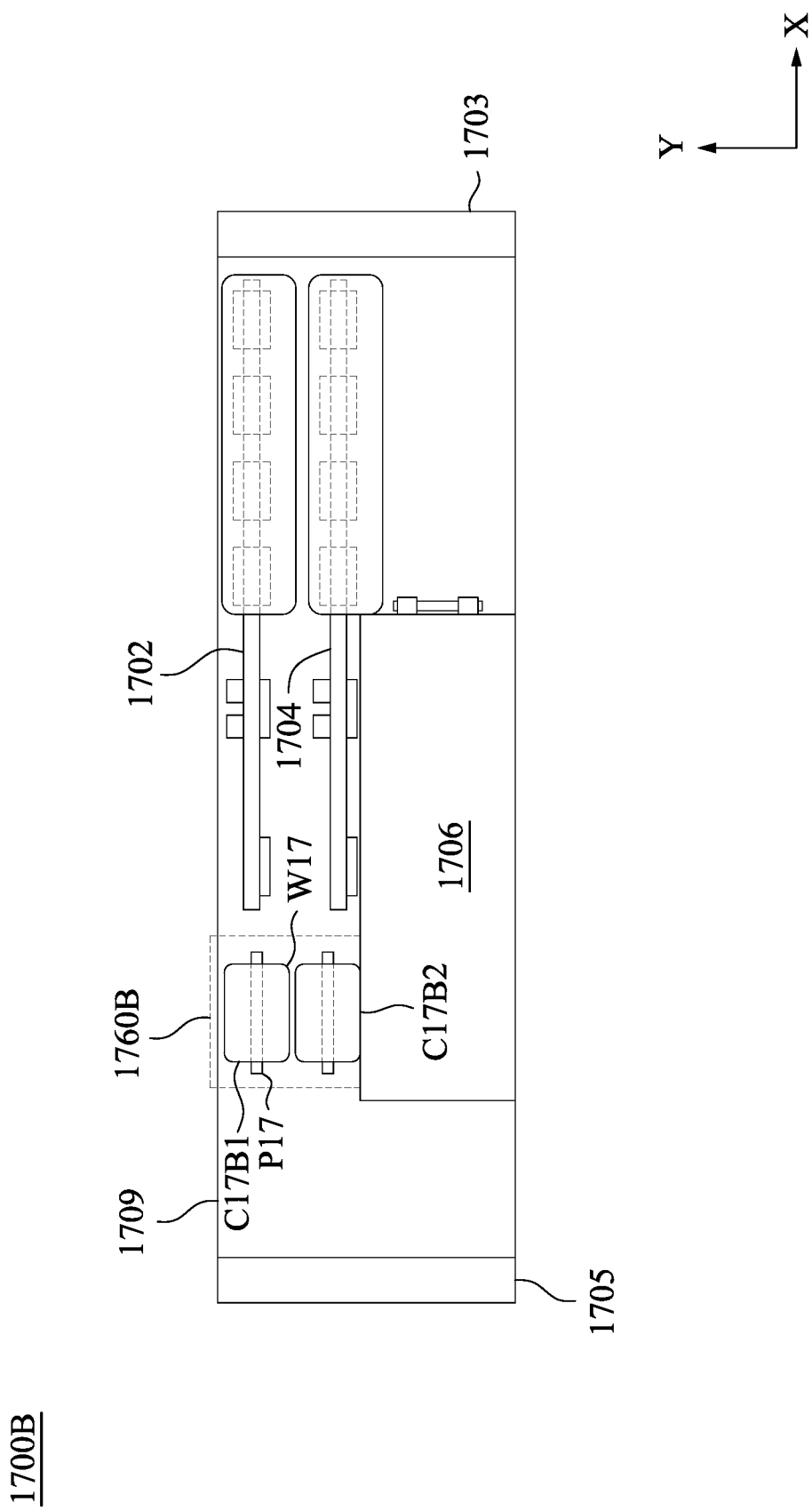
Figure 17C:
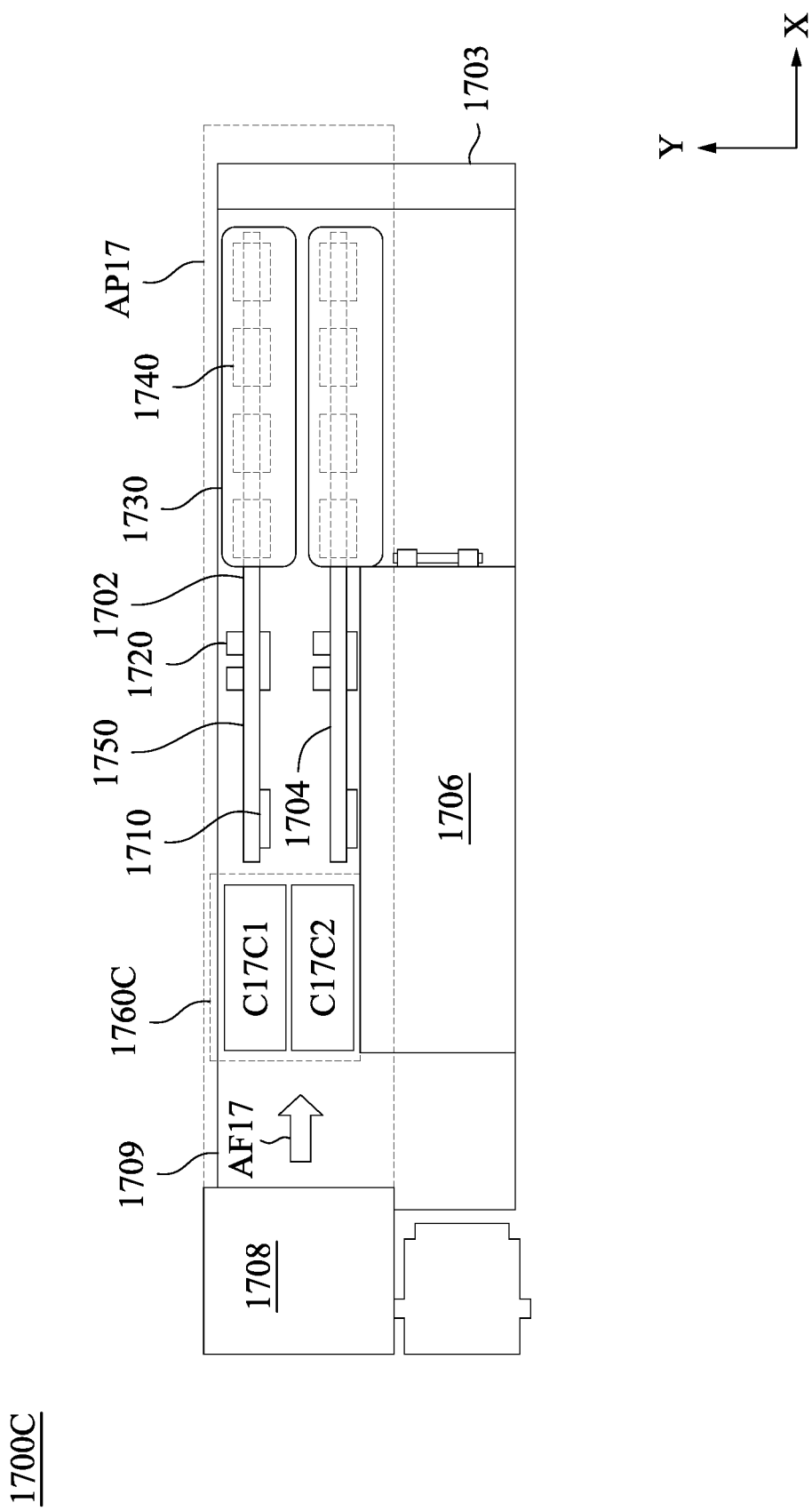

FIG. 17B is a block diagram of a power device 1700B according to an exemplary embodiment of the present disclosure. The power device 1700B is an alternative of the power device 1700A shown in FIG. 17A.

The power device 1700B is similar with the power device 1700A shown in FIG. 17A. For brevity, the discussion will focus more on differences between the power devices 1700A and 1700B than on similarities.

As illustratively shown in FIG. 17B, the differences between the power devices 1700A and 1700B include that the power device 1700B includes a choke part 1760B. The choke part 1760B is disposed on the mainboard 1709 and arranged with the power modules 1702 and/or 1704 along the X-direction.

As illustratively shown in FIG. 17B, the choke part 1760B includes chokes C17B1 and C17B2. The choke C17B1 includes a choke core (not shown), a PCB P17 and a choke winding W17. The choke core is disposed on the PCB P17. The choke winding W17 surrounds around the choke core to form the choke. In some embodiments, a longitudinal side of the PCB P17 is in parallel with the X-direction.

In some embodiments, the choke C17B1 is arranged beside the choke C17B2. The choke C17B2 is similar with the choke C17B1, and thus details of the choke C17B2 are not described herein for brevity. In some other embodiments, the choke C17B2 is different with the choke C17B1.

In various embodiments, at least one of the chokes L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C17B1 and C17B2. For example, the choke C17B1 is configured to operate as the choke L121 and coupled to the switch S121, D121 included in the switch circuit 1710 in some embodiments. In various embodiments, the choke C17B1 is configured to operate as at least one of the chokes L121, L13A1, L13A2, L13B1, L13C1, L13C2, L13D1, L13E1, L13F1, L13F2, L13G1 and L13G2, and coupled to at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 included in the switch circuit 1710 as shown in FIGS. 12, 13A-13G. The number of the chokes included in the choke part 1760B is not limited to two. Other numbers of chokes are within the contemplated scope of the present disclosure.

Figure 18A:
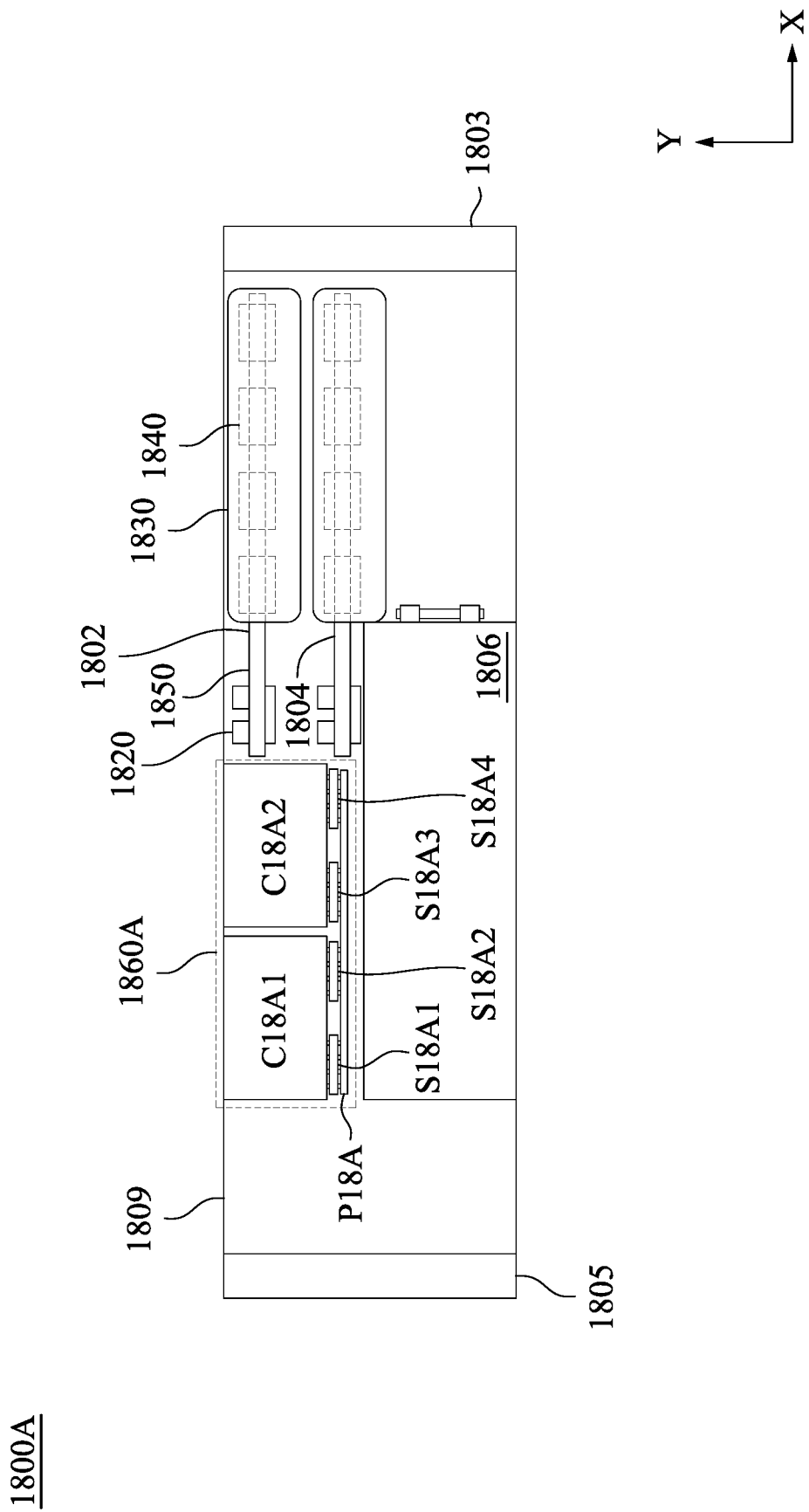

FIG. 18A is a block diagram of a power device 1800A according to an exemplary embodiment of the present disclosure. The power device 1800A is an alternative of the power devices shown in FIGS. 8 and 9.

As illustratively shown in FIG. 18A, the power device 1800A includes power modules 1802, 1804, a bulk capacitor 1806, a regulator 1860A and a mainboard 1809. The power modules 1802, 1804 are embodiments of the power module 500 shown in FIG. 2. The bulk capacitor 1806 is an embodiment of the bulk capacitor 1220 shown in FIG. 12.

As illustratively shown in FIG. 18A, the regulator 1860A, the power modules 1802, 1804 and the bulk capacitor 1806 are disposed on the mainboard 1809. In some embodiments, the power device 1800A further includes an input terminal 1805 and an output terminal 1803 which are disposed on the mainboard 1809 and coupled to the modules 1802, 1804.

In some embodiments, the regulator 1860A is configured to provide at least one voltage to at least one of the power modules 1802, 1804.

As illustratively shown in FIG. 18A, the regulator 1860A and the power modules 1802, 1804 are disposed in the mainboard along the X-direction in order. The number of power modules disposed in the air passage AP18 is not limited to two, other numbers of the power modules are within the contemplated scope of the present disclosure.

As illustratively shown in FIG. 18A, the power module 1802 includes a primary winding circuit 1820, a magnetic element 1830, a secondary winding circuit 1840 and a PCB 1850. The primary winding circuit 1820, the magnetic element 1830, the secondary winding circuit 1840 and the PCB 1850 correspond to the primary winding circuit 7, the magnetic element including the core structure 61, the secondary winding circuit 8 and the PCB 5 shown in FIG. 2, respectively. The primary winding circuit 1820, the magnetic element 1830 and the secondary winding circuit 1840 are disposed on the PCB 1850. The PCB 1850 is disposed on the mainboard 1809 with a longitudinal side of the PCB 1850 in parallel with the X-direction.

As illustratively shown in FIG. 18A, the regulator 1860A includes chokes C18A1, C18A2, a PCB P18A and switches S18A1-S18A4. The switches S18A1-S18A4 are disposed on the PCB P18A. The PCB P18A is disposed on the mainboard 1809 with a longitudinal side of the PCB P18A in parallel with the X-direction. In some embodiments, the chokes C18A1 and C18A2 are traditional winding chokes.

In some embodiments, the X-direction is defined by the direction from the input terminal 1805 to the output terminal 1803 of the power device 1800A. The PCB 1850 is disposed on the mainboard 1809 such that the primary winding circuit 1820 and the magnetic element 1830 are arranged in the X-direction in order. In other word, the PCB 1850 is disposed on the mainboard 1809 with the first direction of the PCB 1850 corresponding to the X-direction from the input terminal 1805 to the output terminal 1803 of the power device 1800A.

In various embodiments, at least one of the chokes L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C18A1 and C18A2. Similarly, at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G are implemented by at least one of the switches S18A1-S18A4.

For example, the choke C18A1 is configured to operate as the chokes L13A1, L13A2 and coupled to the switches S18A1-S18A2 which are configured to operate as the switches S13A1, S13A2 in some embodiments. In various embodiments, the choke C18A1 is configured to operate as at least one of the chokes L121, L13A1, L13A2, L13B1, L13C1, L13C2, L13D1, L13E1, L13F1, L13F2, L13G1 and L13G2, and coupled to the switches S18A1-S18A2 which are configured to operate as at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 as shown in FIGS. 12, 13A-13G. The numbers of the chokes and switches included in the regulator 1860A are not limited. Various numbers of chokes and switches are within the contemplated scope of the present disclosure.

In some embodiments, the power module 1804 is arranged beside the power module 1802. The power module 1804 is similar with the power module 1802, and thus details of the power module 1804 are not described herein for brevity. In some other embodiments, the power module 1804 is different with the power module 1802.

As illustratively shown in FIG. 18A, the bulk capacitor 1806 is disposed on the mainboard, and arranged with the PCB 1850 in a Y-direction orthogonal to the X-direction. In other words, the bulk capacitor 1806 arranged with the power modules 1802, 1804 and the regulator 1860A in the Y-direction.

In some embodiments, the power device 1800A can operate when it is immersed in a liquid, in which the liquid can bring the heat of the power device 1800A and cool the power device 1800A.

In other embodiments, the power device further includes a fan to cool the power device 1800A. As illustratively shown in FIG. 18D with reference to FIG. 18A, comparing to the power device 1800A, the power device 1800D further includes a fan 1808. The fan 1808 is attached to the mainboard 1809 at an end of the mainboard 1809 in the X-direction. The fan 1808 is configured to generate an airflow AF18 flowing in the X-direction. An air passage AP18 is formed due to the airflow AF18. The regulator 1860D and the power modules 1802, 1804 are disposed in the air passage AP18. The regulator 1860D is disposed on the mainboard 1809 and arranged between the power modules 1802, 1804 and the fan 1808. The bulk capacitor 1806 does not hinder the airflow AF18 flowing by the power modules 1802, 1804 and the regulator 1860D.

Comparing to some previous approaches, the arrangement of the regulator 1860D, the power modules 1802, 1804, the fan 1808 and the bulk capacitor 1806 improves thermal conductivity of the power device 1800D.

Figure 18B:
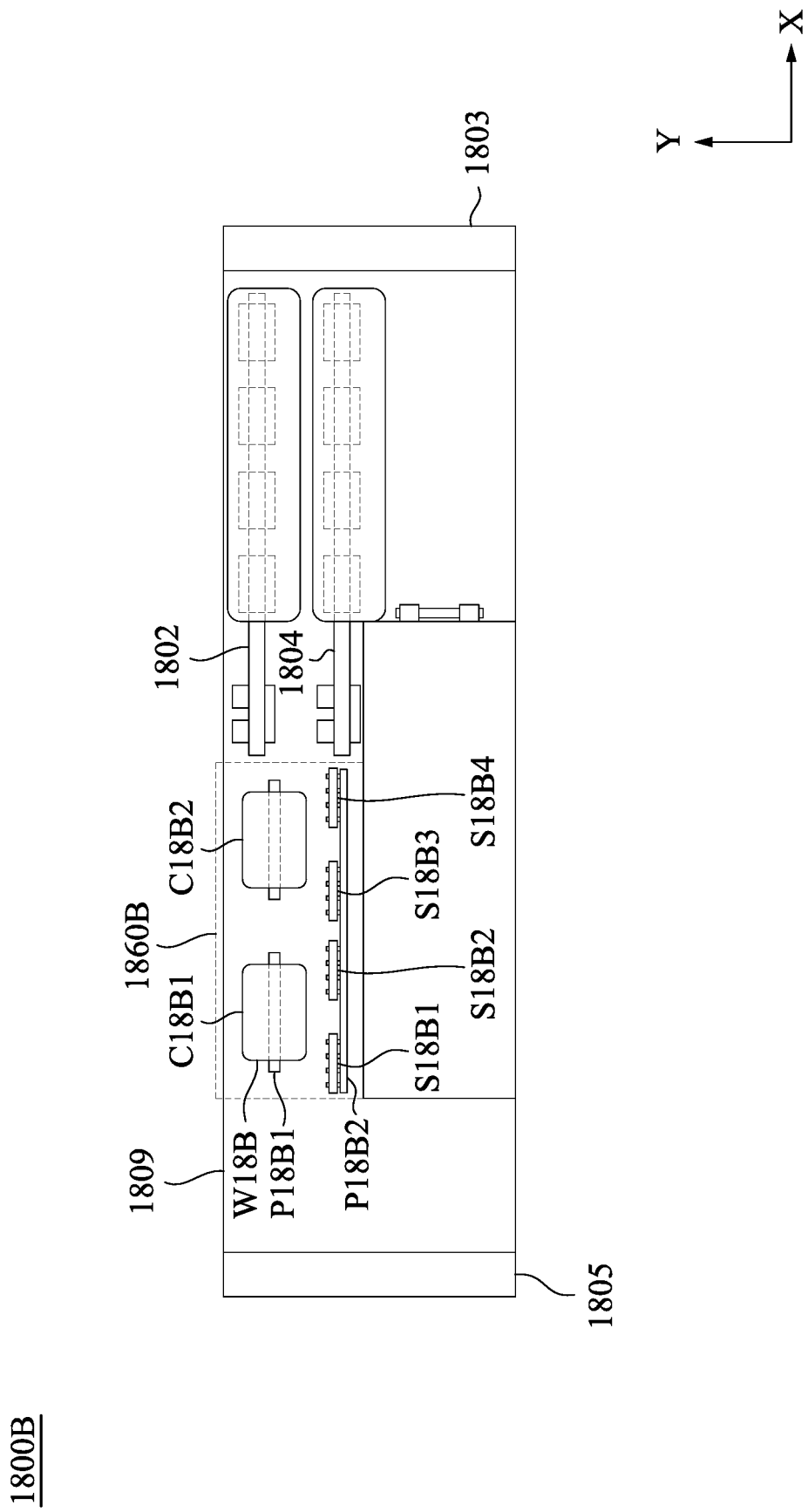

FIG. 18B is a schematic diagram of a power device 1800B according to an exemplary embodiment of the present disclosure. The power device 1800B is an alternative of the power device 1800A shown in FIG. 18A.

The power device 1800B is similar with the power device 1800A shown in FIG. 18A. For brevity, the discussion will focus more on differences between the power devices 1800A and 1800B than on similarities.

As illustratively shown in FIG. 18B, the differences between the power devices 1800A and 1800B include that the power device 1800B includes a regulator 1860B. The regulator 1860B is disposed on the mainboard 1809. In some embodiments, the regulator 1860B is configured to provide at least one voltage to at least one of the power modules 1802, 1804.

As illustratively shown in FIG. 18B, the regulator 1860B includes chokes C18B1 and C18B2. The choke C18B1 includes a choke core, a PCB P18B1 and a choke winding W18B. The choke core is disposed on the PCB P18B1. The choke winding W18B surrounds around the choke core to form the choke C18B1. A longitudinal side of the PCB P18B1 is in parallel with the X-direction.

In some embodiments, the choke C18B1 is arranged beside the choke C18B2. The choke C18B2 is similar to the choke C18B1, and thus details of the choke C18B2 are not described herein for brevity. In some other embodiments, the choke C18B2 is different with the choke C18B1.

As illustratively shown in FIG. 18B, the regulator 1860B further includes a PCB P18B2 and switches S18B1-S18B4. The switches S18B1-S18B4 are disposed on the PCB P18B2.

In various embodiments, at least one of the L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C18B1 and C18B2. Similarly, at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G are implemented by at least one of the switches S18B1-S18B4.

For example, the choke C18B1 is configured to operate as the chokes L13A1, L13A2 and coupled to the switches S18B1-S18B2 which is configured to operate as the switches S13A1, S13A2 in some embodiments. The numbers of the chokes and switches included in the regulator 1860B are not limited. Various numbers of chokes and switches are within the contemplated scope of the present disclosure.

Figure 18C:
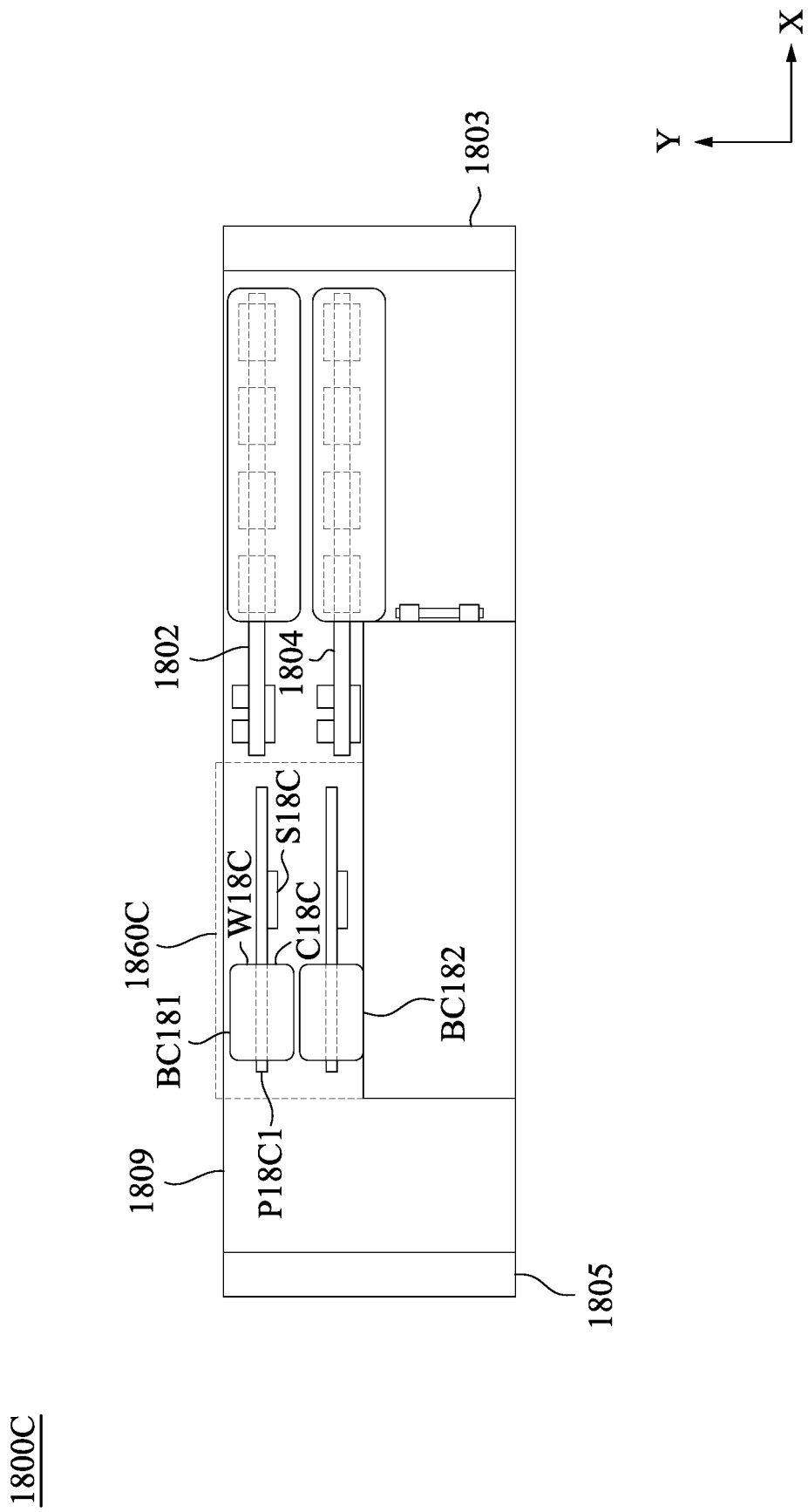
Figure 18D:
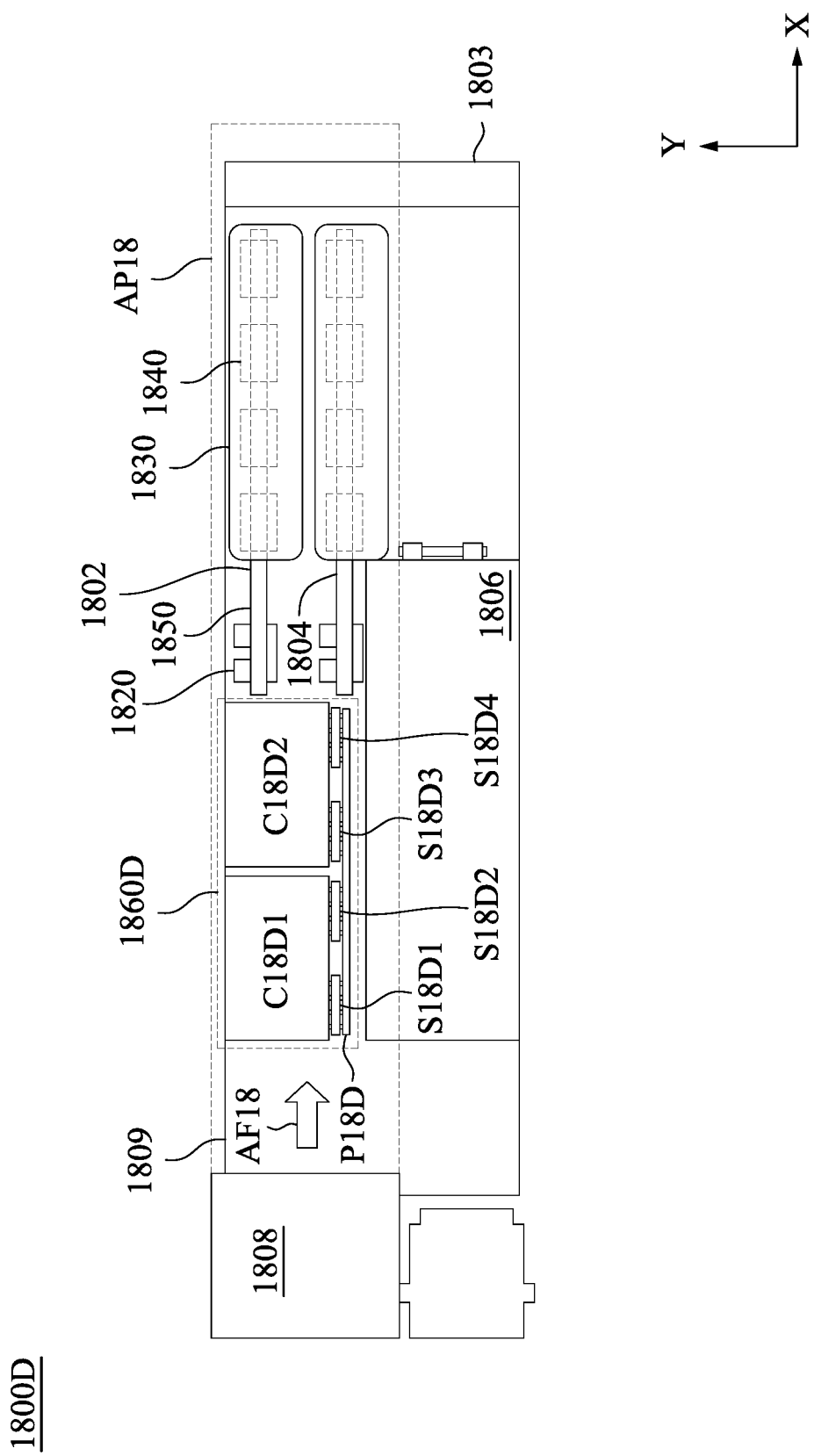

FIG. 18C is a schematic diagram of a power device 1800C according to an exemplary embodiment of the present disclosure. The power device 1800C is an alternative of the power device 1800A shown in FIG. 18A.

The power device 1800C is similar with the power device 1800A shown in FIG. 18A. For brevity, the discussion will focus more on differences between the power devices 1800A and 1800C than on similarities.

As illustratively shown in FIG. 18C, the differences between the power devices 1800A and 1800C include that the power device 1800C includes a regulator 1860C. The regulator 1860C is disposed on the mainboard 1809. In some embodiments, the regulator 1860C is configured to provide at least one voltage to at least one of the power modules 1802, 1804.

As illustratively shown in FIG. 18C, the regulator 1860C includes regulator modules BC181 and BC182. In some embodiments, the regulator module BC181 includes a PCB P18C1, a switch S18C, a choke winding W18C, and a choke core. The PCB P18C1 is disposed on the mainboard 1809. The switch S18C the choke winding W18C, and the choke core are disposed on the PCB P18C1. The choke winding W18C surrounds around the choke core to form the choke C18C. A longitudinal side of the PCB P18C1 is in parallel with the X-direction.

In some embodiments, the regulator module BC182 is arranged beside the power module 1802. The regulator module BC182 is similar with the regulator module BC181, and thus details of the regulator module BC182 are not described herein for brevity. In some other embodiments, the regulator module BC182 is different with the regulator module BC181.

In various embodiments, at least one of the regulator circuit 1210 and 1300A-1300G shown in FIGS. 12, 13A-13G are implemented by at least one of the regulator modules BC181 and BC182.

For example, the regulator module BC181 is configured to operate as the regulator circuit 1210 in some embodiments. The switch S18C and the choke winding W18C correspond to the switch S121 and the choke L121, respectively. In various embodiments, the choke winding W18C corresponds to at least one of the chokes L121, L13A1, L13A2, L13B1, L13C1, L13C2, L13D1, L13E1, L13F1, L13F2, L13G1 and L13G2 shown in FIGS. 12, 13A-13G. In various embodiments, the switch S121 corresponds to at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G. The number of regulator modules included in the regulator 1860C is not limited. Various numbers of regulator modules are within the contemplated scope of the present disclosure.

According to the power modules 1000 and 1100, a switch circuit and/or a choke is integrated with the power modules. The thermal conductivities of the power devices 1600, 1700A, 1700B, 1700C, 1800A, 1800B, 1800C and 1800D are improved by the arrangement described above. Furthermore, the arrangement of the primary winding 1410B reduces the consumption of the winding poles P14B1-P14B3. The arrangement of the core structures 1531 and 1532 facilitates to control a gap between the inductor L122 and the transformer, and improves a utilization of the PCB 1550 of the power module 1500.

The exemplary embodiments of the disclosure has been shown and described above. It should be understood that the disclosure would never be limited to the disclosed embodiments, rather, the present disclosure is intended to cover various modification and equivalent arrangement fallen within the spirit and scope of the attached claims.

What is claimed is:

1. A power module, comprising:
   a first printed circuit board (PCB);
   a magnetic element disposed on the first PCB, wherein the magnetic element has a first side, a second side, a third side and a fourth side, wherein the second side is opposite to the first side along a first direction, the fourth side is opposite to the third side along a second direction different from the first direction;
   a primary winding circuit disposed on the first PCB and positioned in a vicinity of the first side or the second side of the magnetic element;
   a secondary winding circuit disposed on the first PCB and positioned in a vicinity of the third side or the fourth side of the magnetic element; and
   a regulator configured to provide a first voltage to the primary winding circuit, the regulator comprising:
      at least one switch disposed on the first PCB, and coupled to the primary winding circuit,
   wherein the at least one switch, the primary winding circuit, and the magnetic element are arranged in the first direction in order, and
   along the second direction, the primary winding circuit is disposed between two boundaries of the first PCB.

2. The power module of claim 1, wherein the magnetic element comprises:
   a primary winding coupled to the primary winding circuit; and
   a first core structure comprising a magnetic cover, at least two winding poles and a common side pole, wherein the at least two winding poles and the common side pole are disposed on the magnetic cover, and the at least two winding poles are opposite to the common side pole;
   wherein the primary winding is formed by a wire surrounding around the at least two winding poles.

3. The power module of claim 2, wherein the at least two winding poles comprises a first winding pole and a second winding pole,
   wherein
   the first winding pole is adjacent to the second winding pole;
   the first winding pole is surrounded by a first portion of the primary winding; and
   the second winding pole is surrounded by a second portion of the primary winding,
   wherein a current flows clockwise in the first portion when the current flows anticlockwise in the second portion.

4. The power module of claim 2, wherein the magnetic element further comprises at least one inductor winding,
   wherein at least one of the at least two winding poles is at least one inductor column, and at least one of the at least two winding poles other than the at least one inductor column is at least one transformer column, the at least one inductor winding winds around the at least one inductor column, and the primary winding winds around the at least one transformer column.

5. The power module of claim 2, wherein the magnetic element further comprises:
   a second core structure comprising an inductor magnetic cover and an inductor winding pole, wherein the inductor winding pole is disposed on the inductor magnetic cover; and
   an inductor winding surrounding around the inductor winding pole to form an inductor;
   wherein the second core structure is arranged between the first core structure and the primary winding circuit.

6. The power module of claim 1, wherein the regulator further comprises:
   at least one choke coupled to the at least one switch, and disposed on the first PCB,
   wherein the at least one choke, the at least one switch and the primary winding circuit are arranged in the first direction in order.

7. A power device, comprising:
   a mainboard; and
   the power module of claim 1, wherein the first PCB is disposed on the mainboard with the first direction corresponding to a direction from an input terminal to an output terminal of the power device.

8. The power device of claim 7, wherein the regulator further comprises:
   at least one choke coupled to the at least one switch, disposed on the mainboard and arranged with the first PCB in the first direction.

9. The power device of claim 8, wherein each of the at least one choke comprises:
   a second PCB disposed on the mainboard;
   a choke core disposed on the second PCB; and
   a choke winding surrounding around the choke core to form one of the at least one choke.

10. The power device of claim 7, further comprising:
    a bulk capacitor disposed on the mainboard, and arranged with the first PCB in the second direction orthogonal to the first direction.

11. The power device of claim 7, wherein the regulator further comprises:
    at least one choke coupled to the at least one switch, and disposed on the first PCB,
    wherein the at least one choke, the at least one switch and the primary winding circuit are arranged in the first direction in order.

12. The power device of claim 7, further comprising:
    a fan configured to generate an airflow flowing in the first direction, and attached to the mainboard at an end of the mainboard in the first direction, wherein the first PCB is disposed in an air passage of the airflow.

13. The power device of claim 12, wherein the regulator further comprises:
at least one choke coupled to the at least one switch, disposed on the mainboard in the air passage, and arranged between the first PCB and the fan.

14. A power device, comprising:
a mainboard;
at least one power module disposed on the mainboard with a first direction corresponding to a direction from an input terminal to an output terminal of the power device, each of the at least one power module comprising:
a first printed circuit board (PCB);
a magnetic element disposed on the first PCB, wherein the magnetic element has a first side, a second side, a third side and a fourth side, wherein the second side is opposite to the first side along a first direction, the fourth side is opposite to the third side along a second direction different from the first direction;
a primary winding circuit disposed on the first PCB and positioned in a vicinity of the first side or the second side of the magnetic element; and
a secondary winding circuit disposed on the first PCB and positioned in a vicinity of the third side or the fourth side of the magnetic element; and
a regulator disposed on the mainboard, and arranged with the at least one power module in the first direction and configured to provide at least one voltage to the at least one power module,
wherein along the second direction, the primary winding circuit is disposed between two boundaries of the first PCB.

15. The power device of claim 14, wherein the magnetic element comprises:
a primary winding coupled to the primary winding circuit; and
a first core structure comprising a magnetic cover, at least two winding poles and a common side pole, wherein the at least two winding poles and the common side pole are disposed on the magnetic cover, and the at least two winding poles are opposite to the common side pole;
wherein the primary winding is formed by a wire surrounding around the at least two winding poles.

16. The power device of claim 15, wherein the at least two winding poles comprises a first winding pole and a second winding pole,
wherein
the first winding pole is adjacent to the second winding pole;
the first winding pole is surrounded by a first portion of the primary winding; and
the second winding pole is surrounded by a second portion of the primary winding,
wherein a current flows clockwise in the first portion when the current flows anticlockwise in the second portion.

17. The power module of claim 15, wherein the magnetic element further comprises at least one inductor winding,
wherein at least one of the at least two winding poles is at least one inductor column, and at least one of the at least two winding poles other than the at least one inductor column is at least one transformer column, the at least one inductor winding winds around the at least one inductor column, and the primary winding winds around the at least one transformer column.

18. The power device of claim 15, wherein the magnetic element further comprises:
a second core structure comprising an inductor magnetic cover and an inductor winding pole, wherein the inductor winding pole is disposed on the inductor magnetic cover; and
an inductor winding surrounding around the inductor winding pole to form an inductor;
wherein the second core structure is arranged between the first core structure and the primary winding circuit.

19. The power device of claim 14, further comprising:
a bulk capacitor disposed on the mainboard, and arranged with the first PCB in the second direction orthogonal to the first direction.

20. The power device of claim 14, wherein the regulator comprises:
at least one regulator module coupled to the at least one power module, respectively, and disposed in the first direction, each of the at least one regulator module comprising:
a second PCB disposed on the mainboard;
at least one choke disposed on the second PCB; and
at least one switch disposed on the second PCB and coupled to the at least one choke.

21. The power device of claim 14, wherein the regulator comprises:
at least one second PCB disposed on the mainboard;
at least one choke disposed on the at least one second PCB, respectively;
a third PCB disposed on the mainboard; and
at least one switch disposed on the third PCB and coupled to the at least one choke.

22. The power device of claim 14, further comprising:
a fan configured to generate an airflow flowing in the first direction, and attached to the mainboard at an end of the mainboard in the first direction;
wherein the at least one power module and the regulator are disposed in an air passage of the airflow, and the regulator is arranged between the at least one power module and the fan.

* * * * *